(12) United States Patent
Makinwa et al.

(10) Patent No.: US 12,101,105 B2
(45) Date of Patent: Sep. 24, 2024

(54) DELTA-SIGMA MODULATION TYPE A/D CONVERTER

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Kofi Afolabi Anthony Makinwa, Delft (NL); Zhong Tang, Delft (NL)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 178 days.

(21) Appl. No.: 17/967,095

(22) Filed: Oct. 17, 2022

(65) Prior Publication Data

US 2023/0208435 A1   Jun. 29, 2023

(30) Foreign Application Priority Data

Dec. 23, 2021   (JP) .................................. 2021-209475

(51) Int. Cl.
*H03M 3/00* (2006.01)
*H03M 3/02* (2006.01)

(52) U.S. Cl.
CPC .......... *H03M 3/464* (2013.01); *H03M 3/322* (2013.01); *H03M 3/424* (2013.01); *H03M 3/496* (2013.01); *H03M 3/02* (2013.01)

(58) Field of Classification Search
CPC ...... H03M 3/464; H03M 3/322; H03M 3/424; H03M 3/496; H03M 3/02
See application file for complete search history.

(56) References Cited

U.S. PATENT DOCUMENTS

| | | | |
|---|---|---|---|
| 5,835,038 A * | 11/1998 | Nakao | H03M 3/3287 341/131 |
| 7,714,757 B2 | 5/2010 | Denison et al. | |
| 7,795,960 B2 | 9/2010 | Lyden et al. | |
| 8,791,754 B2 | 7/2014 | Lyden et al. | |
| 9,391,628 B1 | 7/2016 | Lyden et al. | |
| 10,135,459 B2 | 11/2018 | Sharma et al. | |
| 10,158,334 B2 | 12/2018 | Wang et al. | |
| 10,158,335 B2 | 12/2018 | Quilligan et al. | |

* cited by examiner

*Primary Examiner* — Joseph J Lauture
(74) *Attorney, Agent, or Firm* — Posz Law Group, PLC

(57) ABSTRACT

A delta-sigma modulation type A/D converter includes: a capacitively coupled amplifier having a sampling capacitor, a feedback capacitor, and an amplifier; a correlated double sampling type first integrator as a first-stage integrator, which is connected to the capacitively coupled amplifier without a switch; a second integrator arranged after the first integrator; a quantizer arranged after the second integrator and quantizing an output of the second integrator; and an D/A converter that D/A-converts an output of the quantizer and feeds back to any one of the capacitively coupled amplifier, the first integrator, and the second integrator.

10 Claims, 19 Drawing Sheets

FIG. 13B

AMP RATE OF FB AM IS 1 — ONE DAC OUTPUT WHEN QUANT OUTPUT ONCE

| QUANT OUTPUT | 0 | 1 | 1 | 1 | 1 | 1 | 1 | 1 | 1 | 1 | 1 | 1 | 1 | 1 | 1 | 1 | 1 | 1 | 1 | 0 |
|---|---|---|---|---|---|---|---|---|---|---|---|---|---|---|---|---|---|---|---|---|
| DAC OUTPUT | -5 | 5 | 5 | 5 | 5 | 5 | 5 | 5 | 5 | 5 | 5 | 5 | 5 | 5 | 5 | 5 | 5 | 5 | 5 | -5 |

AMP RATE OF FB AM IS 1/2 — ONE DAC OUTPUT WHEN QUANT OUTPUT SAME VAL TWICE

| QUANT OUTPUT | 0 | 1 | 1 | 1 | 1 | 1 | 1 | 1 | 1 | 0 | 1 | 1 | 1 | 1 | 1 | 1 | 1 | 1 | 1 | 0 |
|---|---|---|---|---|---|---|---|---|---|---|---|---|---|---|---|---|---|---|---|---|
| DAC OUTPUT | -5 | 5 | 0 | 5 | 0 | 5 | 0 | 5 | 0 | -5 | 0 | 5 | 0 | 5 | 0 | 5 | 0 | 5 | 0 | 0 |

AMP RATE OF FB AM IS 1/3 — ONE DAC OUTPUT WHEN QUANT OUTPUT SAME VAL THREE TIMES

| QUANT OUTPUT | 0 | 1 | 1 | 1 | 1 | 1 | 1 | 1 | 1 | 0 | 1 | 1 | 1 | 1 | 1 | 1 | 1 | 1 | 1 | 0 |
|---|---|---|---|---|---|---|---|---|---|---|---|---|---|---|---|---|---|---|---|---|
| DAC OUTPUT | -5 | 5 | 0 | 0 | 5 | 0 | 0 | 5 | 0 | 0 | 5 | 0 | 0 | 5 | 0 | 0 | 5 | 0 | 0 | -5 |

DELTA-SIGMA MODULATION TYPE A/D CONVERTER

CROSS REFERENCE TO RELATED APPLICATIONS

The present application claims the benefit of priority from Japanese Patent Application No. 2021-209475 filed on Dec. 23, 2021. The entire disclosure of the above application is incorporated herein by reference.

TECHNICAL FIELD

The present disclosure relates to a delta-sigma modulation type A/D converter.

BACKGROUND

For example, according to a device in a conceivable technique, a technique provides a capacitive differential amplifier circuit for an analog differential signal by amplifying an analog differential signal in proportion to a ratio between a first capacitance and a second capacitance of a capacitive differential circuit, and the analog differential signal amplified by the capacitive differential amplifier circuit is integrated by an integrator. Further, another conceivable technique exemplifies an A/D converter that generates a digital output signal based on an analog differential signal amplified by a capacitive differential amplifier circuit.

SUMMARY

According to an example, a delta-sigma modulation type A/D converter includes: a capacitively coupled amplifier having a sampling capacitor, a feedback capacitor, and an amplifier; a correlated double sampling type first integrator as a first-stage integrator, which is connected to the capacitively coupled amplifier without a switch; a second integrator arranged after the first integrator; a quantizer arranged after the second integrator and quantizing an output of the second integrator; and an D/A converter that D/A-converts an output of the quantizer and feeds back to any one of the capacitively coupled amplifier, the first integrator, and the second integrator.

BRIEF DESCRIPTION OF THE DRAWINGS

FIG. 13B is an operation example diagram of a feedback amount adjustment circuit showing a sixth embodiment.

DETAILED DESCRIPTION

Figure 1:
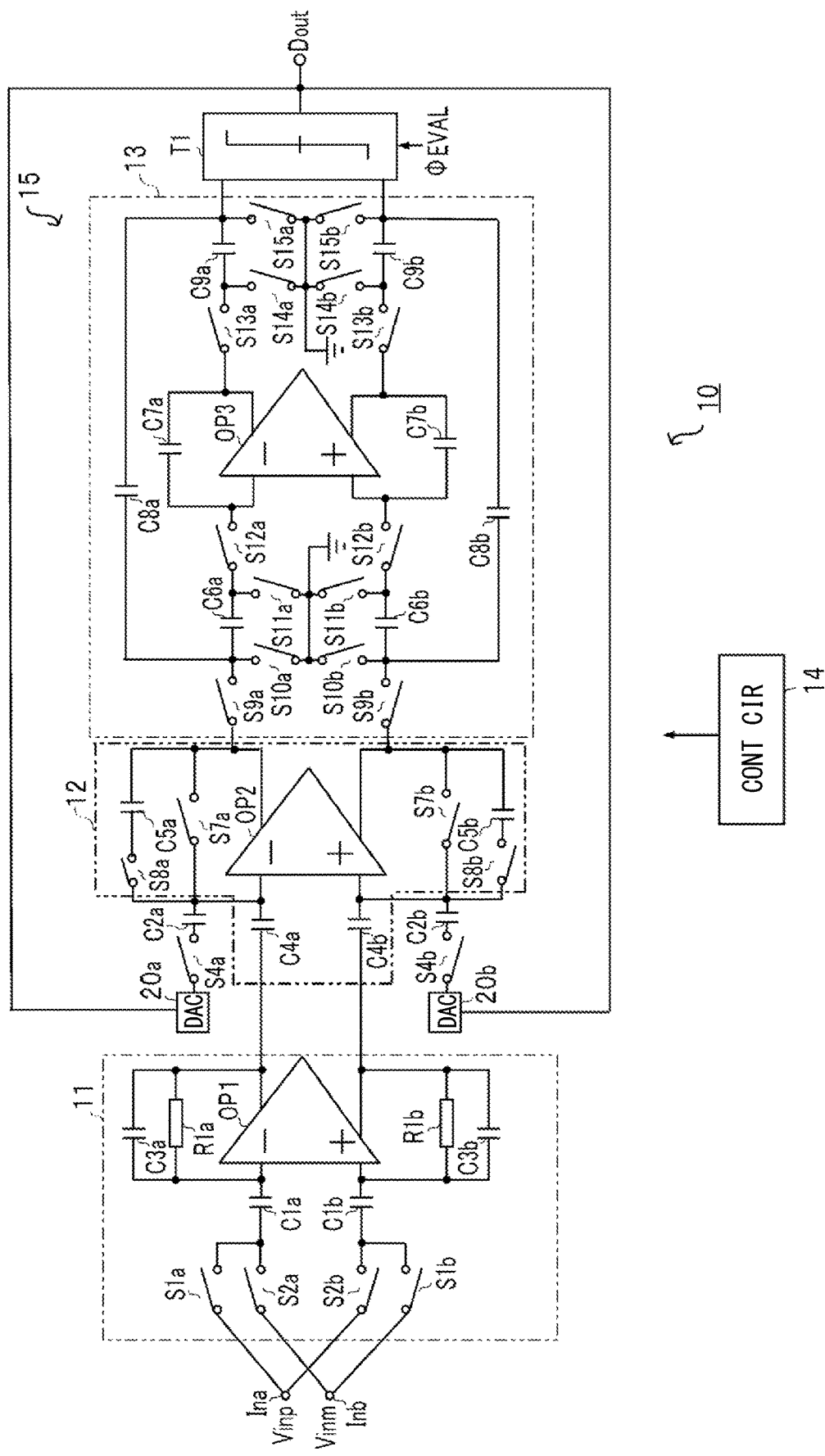
FIG. 1 is an electrical configuration diagram of an A/D converter according to a first embodiment.

According to the conceivable technique, it is not described that the MY modulator is built in generally, and the configuration may not be not such that high-precision A/D conversion can be performed. Even if the configuration of the other conceivable technique is adopted, there may be room for improvement in reducing the offset.

The present embodiments provide a delta-sigma modulation type A/D converter for performing A/D conversion with high accuracy while reducing an offset.

The present embodiments provide a delta-sigma modulation type A/D converter that digitally converts an analog input signal. The converter is configured with a sampling capacitance, a feedback capacitance, and an amplifier, and has a capacitively coupled amplifier that amplifies an analog input signal. The converter includes a correlated double sampling type first integrator as the first stage integrator after the capacitively coupled amplifier, and the output of the capacitively coupled amplifier and the input of the sampling capacitance of the first integrator are directly connected without a switch. In addition, a second integrator is provided after the first integrator. Further, a quantizer for quantizing the output value of the second integrator is provided after the second integrator. The D/A converter D/A-converts the output of the quantizer and feeds it back to any of the capacitively coupled amplifier, the first integrator, and the second integrator.

Hereinafter, embodiments of an A/D converter will be explained with reference to the drawings. In each embodiment, substantially the same or similar parts are given the same reference numeral or a similar reference numeral (for example, the same number is added to the one's and ten's digits and another number is added to the hundred's digit), and the description thereof is omitted as necessary. And, in each embodiment, the feature portions will be mainly described. Further, in the following embodiment, a differential circuit will be used for description, and the circuit components having a symmetrical differential configuration will be illustrated and described with subscripts a and b.

First Embodiment

Figure 6:
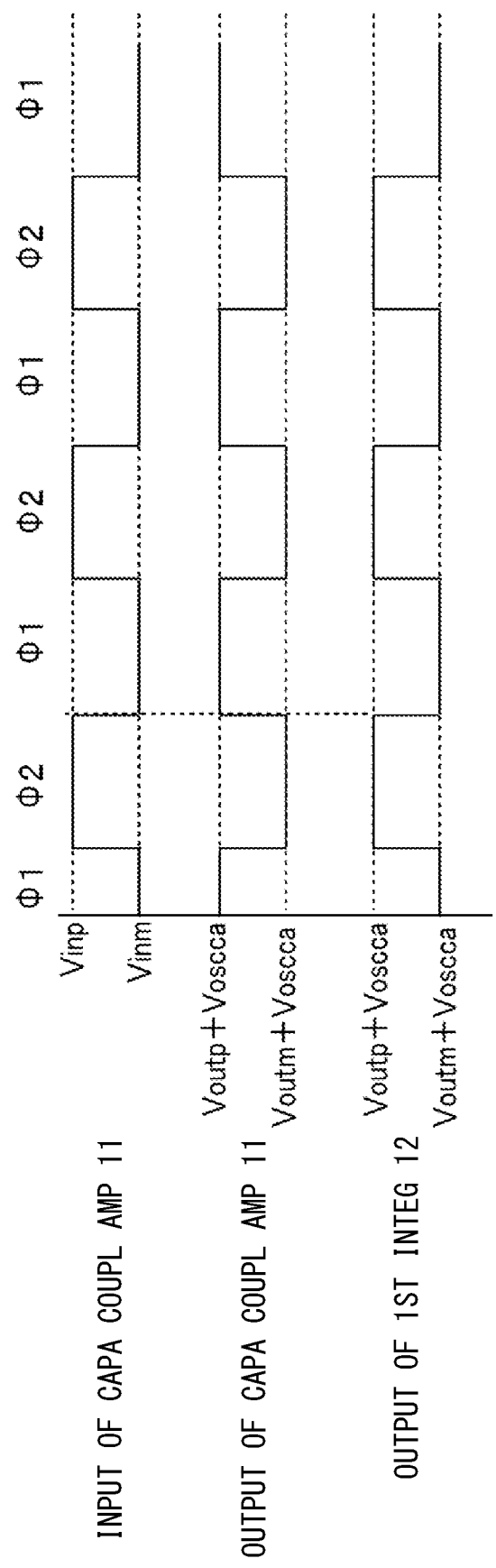
FIG. 6 is a time chart for explaining the offset reduction effect in the first embodiment.

A first embodiment will be described with reference to FIGS. 1 and 6. FIG. 1 shows a schematic configuration of a ΔΣ type A/D converter 10. In the first embodiment, a feature in which the A/D converter 10 has a CIFF configuration will be described.

The A/D converter 1 includes a capacitively coupled amplifier 11, a first integrator 12, a second integrator 13, and a control circuit 14. Further, a quantizer T1 is configured in the output stage of the second integrator 13. The ΔΣ modulator 15 has a feedback configuration including the first integrator 12, the second integrator 13, the quantizer T1, and D/A converters 20a and 20b. The D/A converters 20a and 20b indicate the equivalent of the second D/A converter according to the present embodiment. The control circuit 14 includes a microcomputer, a logic circuit, or the like, and is configured to output a control signal to each configuration of the capacitively coupled amplifier 11, the first integrator 12, the second integrator 13, the quantizer T1, and the D/A converters 20a and 20b.

The differential analog input signals Vinp and Vinm are input to the capacitively coupled amplifier 11 through the input terminals Ina and Inb. At this time, a voltage of about "Vinp−Vinm=±100 mV" is applied. Since the offset voltage "Vcm=±100 mV" is also input to the input terminals Ina and Inb, the voltages of "Vinp=+Vdiff/2+Vcm" and "Vinm=−Vdiff/2+Vcm" are input to the input terminals Ina and Inb, respectively.

The capacitively coupled amplifier 11 mainly includes the fully differential type operational amplifier OP1, and is configured by connecting the resistors R1a and R1b and the parallel connection circuit of the capacitors C3a and C3b which provide feedback capacitances between the input and output of the operational amplifier OP1. The resistors R1a and R1b are provided to determine the input voltage. Further, capacitors C1a and C1b having sampling capacitances are connected between the input terminals Ina and Inb and the inverting input terminal and the non-inverting input terminal of the operational amplifier OP1, respectively.

Further, switches S1a and S2b are interposed and connected between the input terminal Ina and the inverting input terminal and the non-inverting input terminal of the operational amplifier OP1, respectively. Switches S2a and S1b are interposed and connected between the input terminal Inb and the inverting input terminal and the non-inverting input terminal of the operational amplifier OP1, respectively. By controlling the switches S1a, S1b, S2a, and S2b on and off by the control circuit 14, the analog input signals Vinp and Vinm can be polarly inverted and input to the operational amplifier OP1. The output of the operational amplifier OP1 and the inputs of the capacitors C1a and C1b of the first integrator 12 are directly connected without a switch, and no switch is interposed between the input and output of the operational amplifier OP1.

The output of the capacitively coupled amplifier 11 is input to the first integrator 12. In other words, the capacitively coupled amplifier 11 that amplifies the analog input signals Vinp and Vinm is connected to the front stage of the first integrator 12. The first integrator 12 constitutes a first-stage integrator, and is a so-called correlated double sampling (CDS) type integrator. The first integrator 12 also mainly includes a fully differential operational amplifier OP2. The output of the operational amplifier OP1 is input to the input of the operational amplifier OP2 via the capacitors C4a and C4b as a sampling capacitor.

A short-circuit switching path and an energization path of the capacitors C5a and C5b are connected in parallel between the input and output of the operational amplifier OP2. Switches S7a and S7b are configured between the input and output of the operational amplifier OP2 in the short-circuit switching path. The capacitors C5a and C5b and the switches S8a and S8b are connected in series to the energization path of the capacitors C5a and C5b, and the charging and discharging of the capacitors C5a and C5b can be switched by using the switches S8a and S8b.

The output of the first integrator 12 is input to the second integrator 13. The second integrator 13 also mainly includes a fully differential operational amplifier OP3. The output of the operational amplifier OP2 is connected to the input of the operational amplifier OP3 via the capacitors C6a and C6b. Further, switches S9a, S9b, S10a, S10b, S11a, S11b, S12a, and S12b are connected to each other between the output of the operational amplifier OP2 and the input of the operational amplifier OP3 in a illustrated manner. These switches S9a, S9b, S10a, S10b, S11a, and S11b indicate switches that can be switched when the capacitors C6a and C6b are charged from the capacitors C5a and C5b or when the capacitors C6a and C6b are discharged.

Capacitors C7a and C7b are connected as feedback capacitances between the input and output of the operational amplifier OP3. The switches S12a and S12b indicate switches that can be switched when the capacitors C7a and C7b are charged from the capacitors C6a and C6b. The output of the operational amplifier OP3 is connected to the input of the quantizer T1 via capacitors C9a and C9b. Further, switches S13a, S13b, S14a, S14b, S15a, and S15b are connected between the output of the operational amplifier OP3 and the input of the quantizer T1 in the illustrated manner. These switches S13a and S13b indicate switches that can be switched when the capacitors C9a and C9b are charged from the capacitors C7a and C7b, and switches S14a, S14b, S15a and S15b indicate switches that can be switched when the capacitors C9a and C9b are discharged.

The quantizer T1 converts the level of the output of the second integrator 13 into a binary digital signal Dout of "1" or "0". Further, the digital signal Dout of the quantizer T1 is input to the D/A converters 20a and 20b. The D/A converters 20a and 20b of the present embodiment feed back to the first integrator 12 based on the binary value of the digital signal Dout. The D/A converters 20a and 20b are circuits that output two levels of high potential, for example, +5V, or low potential, for example, 0V, based on the digital signal Dout.

The switches S4a and S4b and the capacitors C2a and C2b are connected in series between the D/A converters 20a and 20b and the input of the operational amplifier OP2 constituting the first integrator 12, and, when the control circuit 14 turns on the switches S4a and S4b, the D/A converters 20a and 20b feed back to the first integrator 12.

The operation and effect of the above configuration will be described. As shown in the time chart in FIG. 2, the control circuit 14 outputs the on/off control signals φ1, φ2, φ1d, and φ2d to the target switches S1a, S1b to S15a, and S15b to control the switches S1a, S1b to S15a, and S15b to turn on and off. Refer to FIGS. 2 to 5 for detailed on/off control contents of the switches S1a, S1b to S15a, and S15b. FIG. 3 illustrates the on/off control signals φ1, φ2, φ1d, and φ2d applied to each switch. Further, the control circuit 14 outputs the control signal φEVAL to the quantizer T1 to sample the input signal at the rise edge timing ta of the control signal φEVAL, and the sampling voltage at the subsequent fall edge timing tb of the control signal φEVAL is digitally converted and output as a digital signal Dout.

Figure 4:
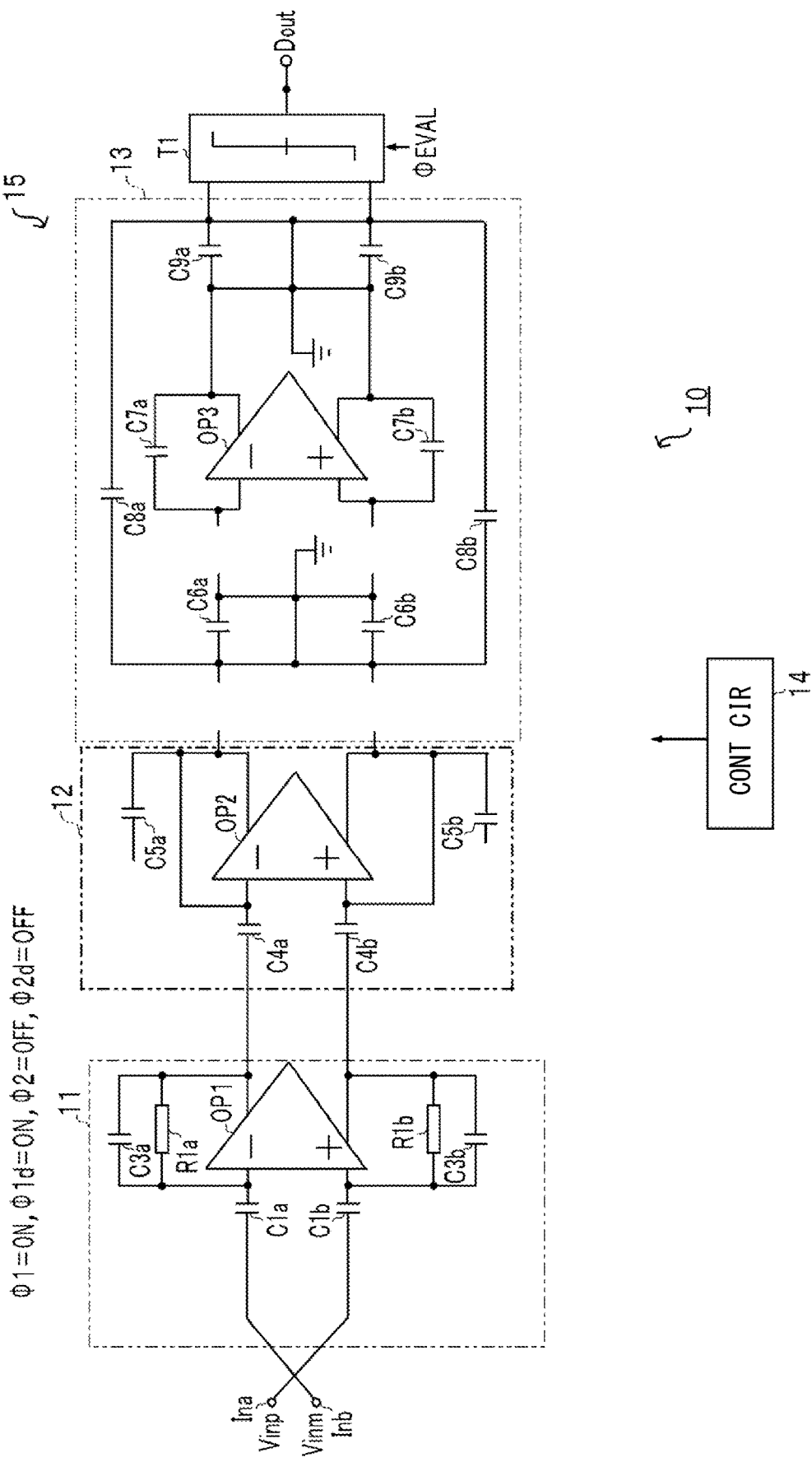
FIG. 4 is a circuit connection diagram at the time of amplification showing the first embodiment.
Figure 5:
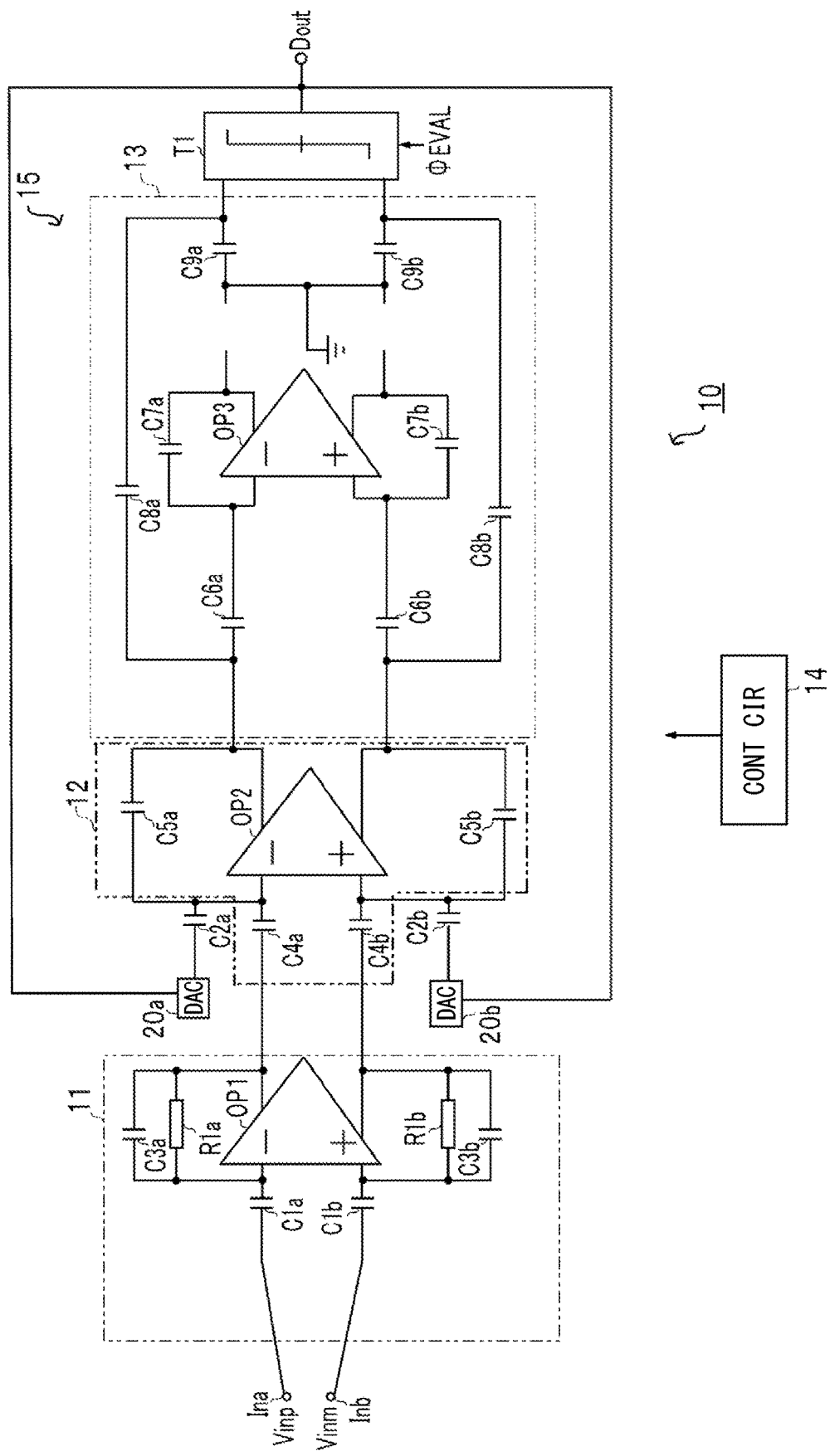
FIG. 5 is a circuit connection diagram at the time of feedback of the D/A converter showing the first embodiment.

The on/off control signals φ1 and φ2 are controls signals for complementary turning on/off, and the on/off control signals φ1d and φ2d are also control signals for complementary turning on/off. Further, the on/off control signals φ1d and φ2d are control signals output so as to be slightly delayed as compared with the on/off control signals φ1 and φ2. FIG. 4 shows the connection state when the on/off control signals of "φ1=ON", "φ1d=ON", "φ2=OFF", and "φ2d=OFF", and FIG. 5 shows the connection state when the on/off control signals of "φ1=OFF", "φ1d=OFF", "φ2=ON", "φ2d=ON".

The flow and operation of signal processing will be briefly described below.

<Explanation of on/Off Operation of Each Switch and Flow of Signal Processing>

Figure 2:
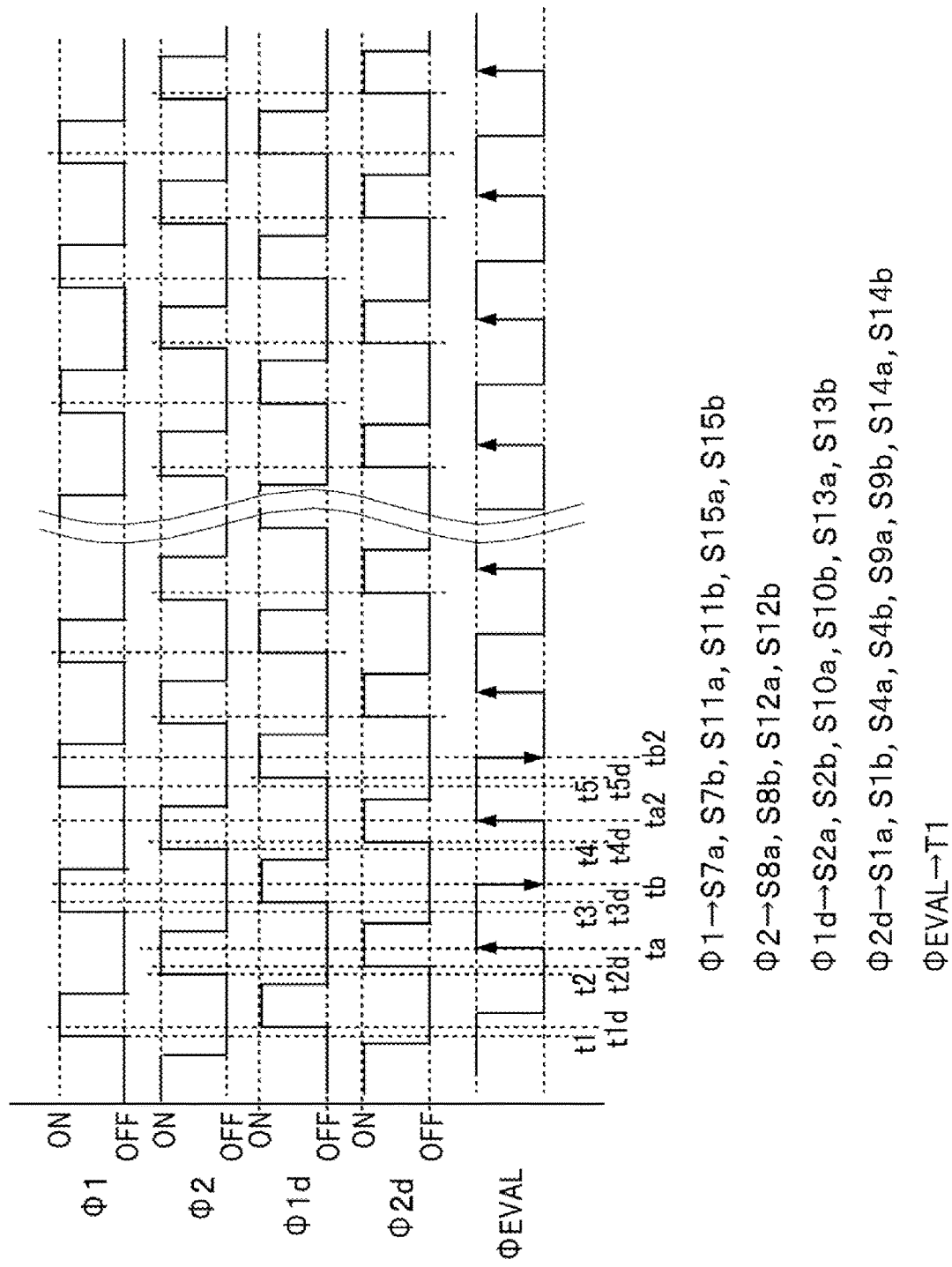
FIG. 2 is an example diagram of a control signal applied to each configuration such as a switch for the first embodiment.
Figure 3:
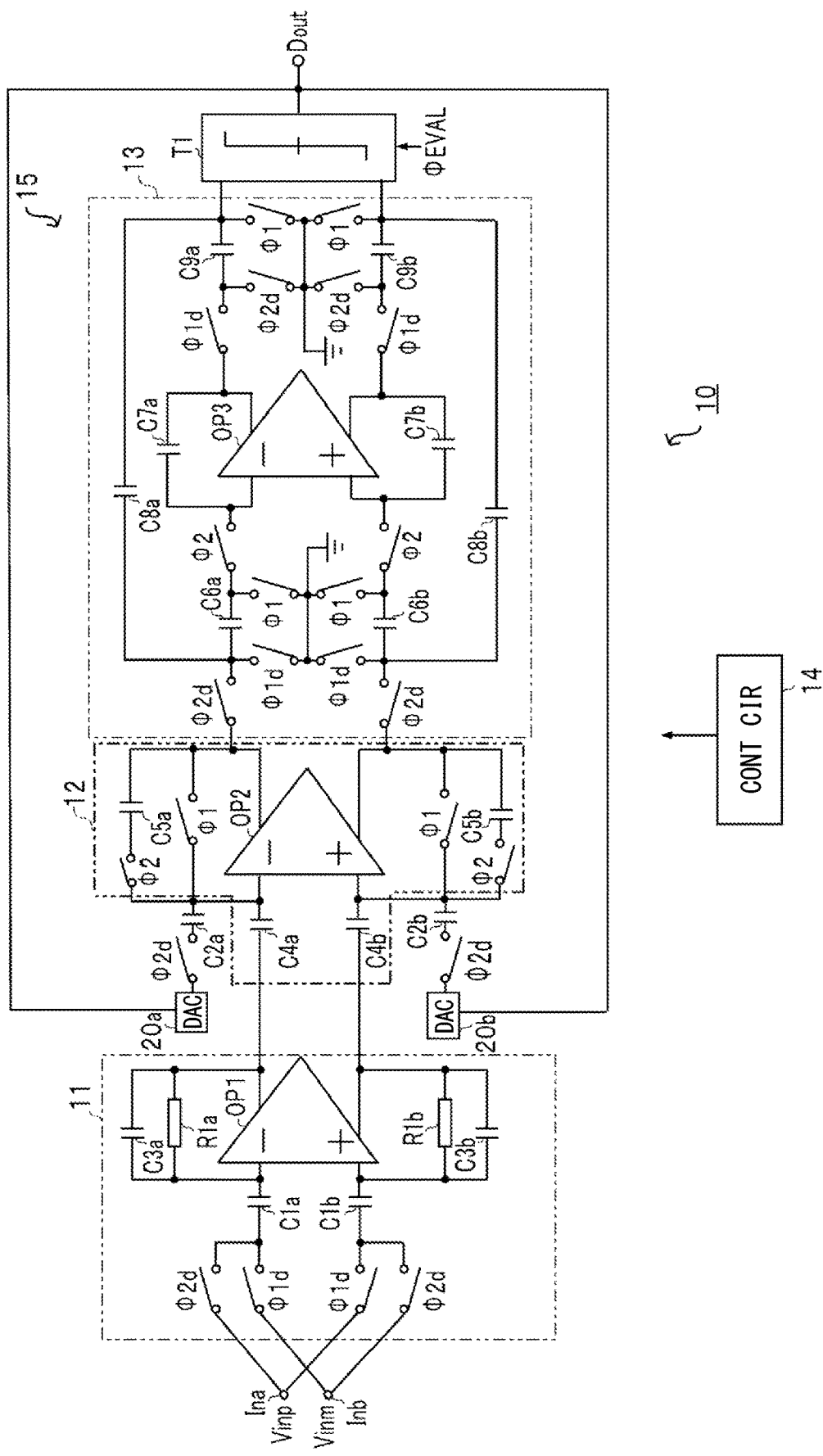
FIG. 3 is an explanatory diagram of an on/off control signal applied to each switch shown in the first embodiment.

First, at the timings t1 and t1d shown in FIG. 2, when the on/off control signals φ1, φ2, φ1d and φ2d become the state of "φ1=ON", "φ1d=ON", "φ2=OFF" and "φ2d=OFF", the switches S2a and S2b are switched on by the signal of "φ1d=ON". Thus, as shown in FIG. 4, the analog input signals Vinp and Vinm are input to the capacitors C1b and C1a of the capacitively coupled amplifier 11. Further, since the switches S8a and S8b are turned off, the charges of the capacitors C4a and C5b are maintained.

After that, when the on/off control signals φ1, φ2, φ1d, and φ2d become the state of "φ1=OFF", "φ1d=OFF", "φ2=ON", and "φ2d=ON" at the timings t2 and t2d, the wiring connection shown in FIG. 5 is performed. At this time, since the stored charges of the capacitors C1a and C1b at the input of the capacitively coupled amplifier 11 are discharged, the input voltage is lowered, the voltage of the output terminal is also lowered, and the input voltage of the first integrator 12 is also lowered.

By changing the input voltage from Vinp to Vinm, the capacitively coupled amplifier 11 inputs and amplifies the input voltage "Vinp−Vinm". Subsequently, it is sampled in the capacitors C4a and C4b which are the sampling capacitances of the first integrator 12. As the input voltage of the first integrator 12 decreases, the output values of the capacitors C5a and C5b become large, and as a result, the change amount of this time is added to the output value up to the previous time to be integrated and output.

On the other hand, since the switches S9a and S9b are turned on by the on/off control signal of "φ2d=ON", the accumulated charges of the capacitors C5a and C5b are distributed to the capacitors C6a and C6b. Further, since the switches S12a and S12b are turned on, the second integrator 13 inputs the integrated output of the first integrator 12 and further integrates and outputs it, and accumulates charges in the capacitors C7a and C7b from the output of the operational amplifier OP3.

After that, when the on/off control signals φ1, φ2, φ1d, and φ2d become the state of "φ1=ON", "φ1d=ON", "φ2=OFF", and "φ2d=OFF2 at the timings t3 and t3d, the switches S13a and S13b are turned on. Thus, as shown in FIG. 4, the integrated output of the second integrator 13 is sampled by the capacitors C9a and C9b.

On the other hand, when the on/off control signals become the state of "φ1=ON" and "φ1d=ON", the accumulated charges of the capacitors C6a and C6b are discharged. In the capacitively coupled amplifier 11 and the first integrator 12, the capacitively coupled amplifier 11 amplifies the analog input signal due to the same operation as described above.

After that, when the on/off control signals φ1, φ2, φ1d, and φ2d become the state of "φ1=OFF", "φ1d=OFF2, "φ2=ON", and "φ2d=ON2 at the timings t4 and t4d in FIG. 2, the switches S14a and S14b are turned on after the switches S15a and S15b are turned off, so that a voltage based on the accumulated voltage of the capacitors C9a and C9b is input to the quantizer T1 with reference to the ground potential. The quantizer T1 inputs the voltages of the capacitors C9a and C9b at the timing ta2 of FIG. 2, and generates a digital signal Dout based on the voltages.

After that, at the timings t5 and t5d in FIG. 2, the on/off control signals φ1, φ2, φ1d and φ2d become the state of "φ1=ON", "φ1d=ON", "φ2=OFF" and "φ2d=OFF2, and then the quantizer T1 outputs to the D/A converters 20a and 20b at the timing tb2. The D/A converters 20a and 20b feed back high or low potentials to the first integrator 12 based on the digital signal Dout, and then the first integrator 12 adds the outputs of the D/A converters 20a and 20b to integrate and output.

These operations can be summarized as follows. The charging and discharging are repeated from the operation of the switched capacitor, the previous output is held at the timing of the on/off control signals of "φ1=ON" and "φ1d=ON" shown in FIG. 4, and then the charge is transferred to the capacitors C5a and C5b, which are the feedback capacitances of the first integrator 12 at the timing of the on/off control signals of "φ2=ON" and "φ2d=ON" shown in FIG. 5, and at the same time, the charge is transferred to the capacitors C7a and C7b of the second integrator 13, and the charge is transferred to the capacitors C9a and C9b at the timing of the on/off control signals of "φ1=ON" and "φ1d=ON" shown in FIG. 4.

Further, at the timing ta2 during the on/off control signals become the state of "φ2=ON" and "φ2d=ON" shown in FIG. 5, it can be input to the quantizer T1, and then the quantizer T1 outputs the digital signal Dout at the timing tb2. This digital signal Dout is fed back from the D/A converters 20a and 20b to the first integrator 12 through the capacitors C2a and C2b having DAC capacitances.

According to this operation, since the input side of the operational amplifier OP2 has high impedance and the output side has low impedance, the output value of the first integrator 12 is determined by the amount of charge transfer between the capacitors C4a, C4b and the capacitors C5a, C5b when the on/off control signal changes from the state of "φ1=OFF" to the state of "φ2=ON".

Since the charges of the capacitors C4a and C4b are determined by the on-timing of the on-off control signal φ1 before the on-timing of the on-off control signal φ1d, the ON timing of the on-off control signal φ1d does not affect on the output of the first integrator 12. The capacitance values of the capacitors C1a and C1b are defined as Csc and the capacitance values of the capacitors C3a and C3b are defined Cfc. When observing the preceding stage from the input of the first integrator 12, the capacitively coupled amplifier 11 is regarded as a continuous amplifier that only amplifies by a ratio of Csc/Cfc.

The offset reduction effect, which is the technical feature of the above configuration, will be described. FIG. 6 shows an explanatory diagram of the offset canceling effect. The offset generated at the input terminal of the operational amplifier OP1 is Voscca, and the offset generated at the input terminal of the operational amplifier OP2 is Voscds.

At this time, the output voltage of "Voutp−Voutm" of the capacitively coupled amplifier 11 is calculated by an equation of:

$$Voutp - Voutm = Csc(Vinp - Vinm)/Cfc.$$

Further, the output voltage Vout of the first integrator 12 is calculated by an equation of:

$$Vout = Cs1\{(Voutp + Voscca) - (Voutm + Voscca)\}/Cf1$$
$$= Cs1(Voutp - Voutm)/Cf1$$
$$= Cs \cdot Csc(Vinp - Vinm)/Cf1 \cdot Cfc.$$

Since the output voltage of the first integrator 12 is calculated by an equation of "Vout+Voscds", the output voltage is calculated by an equation of:

$$Vout+Voscds=Cs1 \cdot Csc(Vinp-Vinm)/Cf1 \cdot Cfc+Voscds.$$

In the configuration of the present embodiment, the offset Voscca input to the capacitively coupled amplifier 11 is cancelled by the first integrator 12. Therefore, the offset can be improved by the gain of the capacitively coupled amplifier 11 as a whole.

(Overview)

According to this embodiment, the capacitively coupled amplifier 11 is configured in front of the first integrator 12. The analog input signal of "Vinp–Vinm" can be amplified by the capacitively coupled amplifier 11 as compared with the case where the first integrator 12 is a mere secondary delta-sigma modulator of correlated double sampling (CDS). The output value is determined at the timing of the sample hold of the first integrator 12, and from the viewpoint of the first integrator 12, the capacitively coupled amplifier 11 can be regarded as a continuous amplifier, so that it is not affected by sampling noise.

Since the first integrator 12 is configured as a correlated double sampling type and can perform a double-sampling, it is not affected by the offset of the capacitively coupled amplifier 11. Therefore, as a whole, the influence of the offset can be suppressed and improved by the gain of the capacitively coupled amplifier 11. This makes it possible to perform A/D conversion with high accuracy while reducing the offset.

By using the configuration of the capacitively coupled amplifier 11 and the first integrator 12 as a delta-sigma modulator that feeds back the output of the quantizer T1 by the D/A converters 20a and 20b, instead of using the configuration of the capacitively coupled amplifier 11 and the first integrator 12 as a mere integrator, the analog input signal of "Vinp–Vinm" can be continuously integrated without saturating the output of the first integrator 12, and A/D conversion can be performed with high accuracy.

According to this embodiment, the capacitively coupled amplifier 11 and the first integrator 12 can be directly connected without the requirement to provide a switch or the like therebetween. Since the switch is not required, control can be performed without being affected by the on-state resistance of the switch, injection, and the like, and A/D conversion can be performed with high accuracy.

In this embodiment, since the CIFF configuration is adopted, it is not necessary to feed back the feedback outputs of the D/A converters 20a and 20b to the second integrator 13, and the feedback path can be reduced, so that the configuration can be simplified.

Second Embodiment

Figure 7:
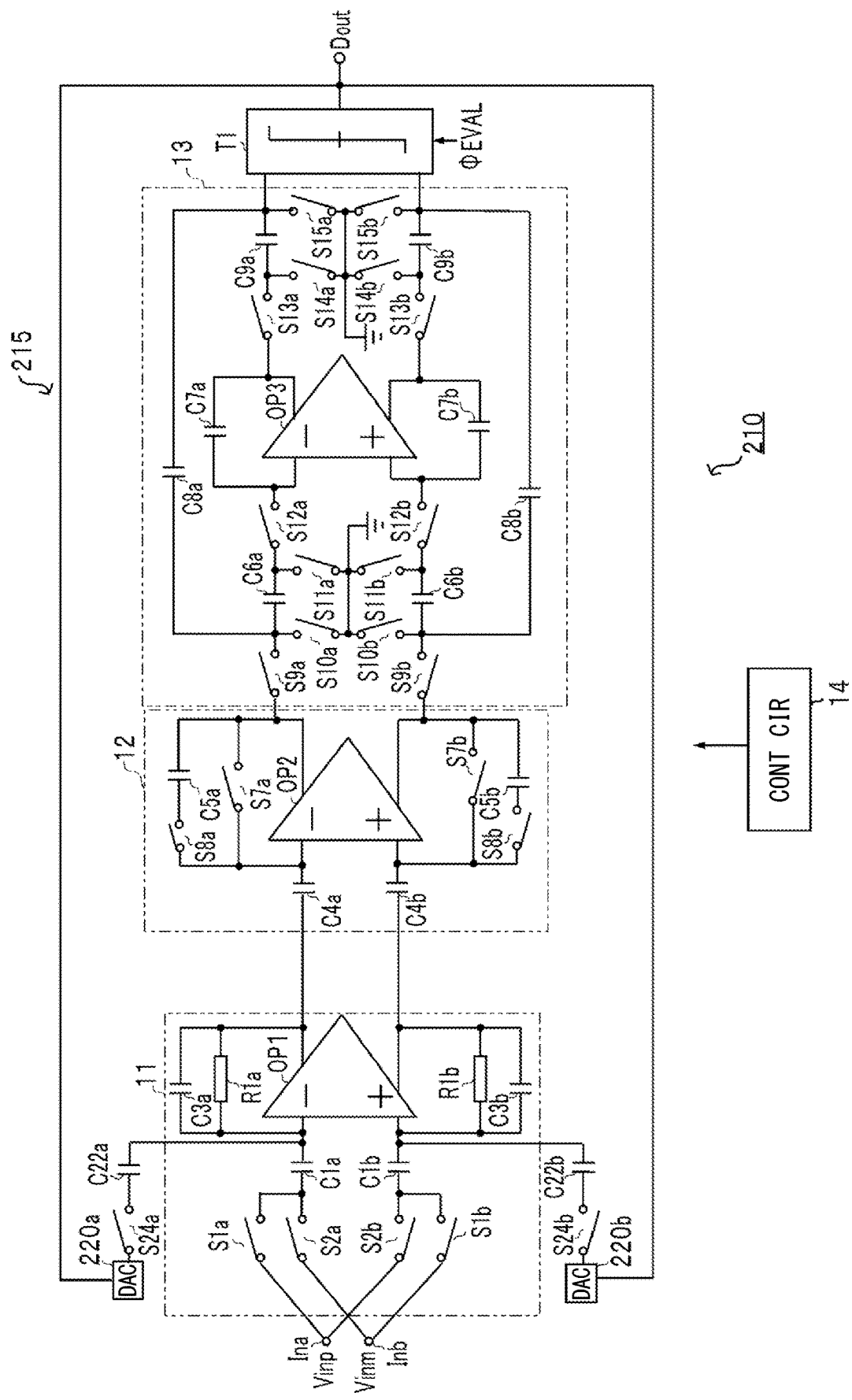
FIG. 7 is an electrical configuration diagram of an A/D converter showing a second embodiment.
Figure 8:
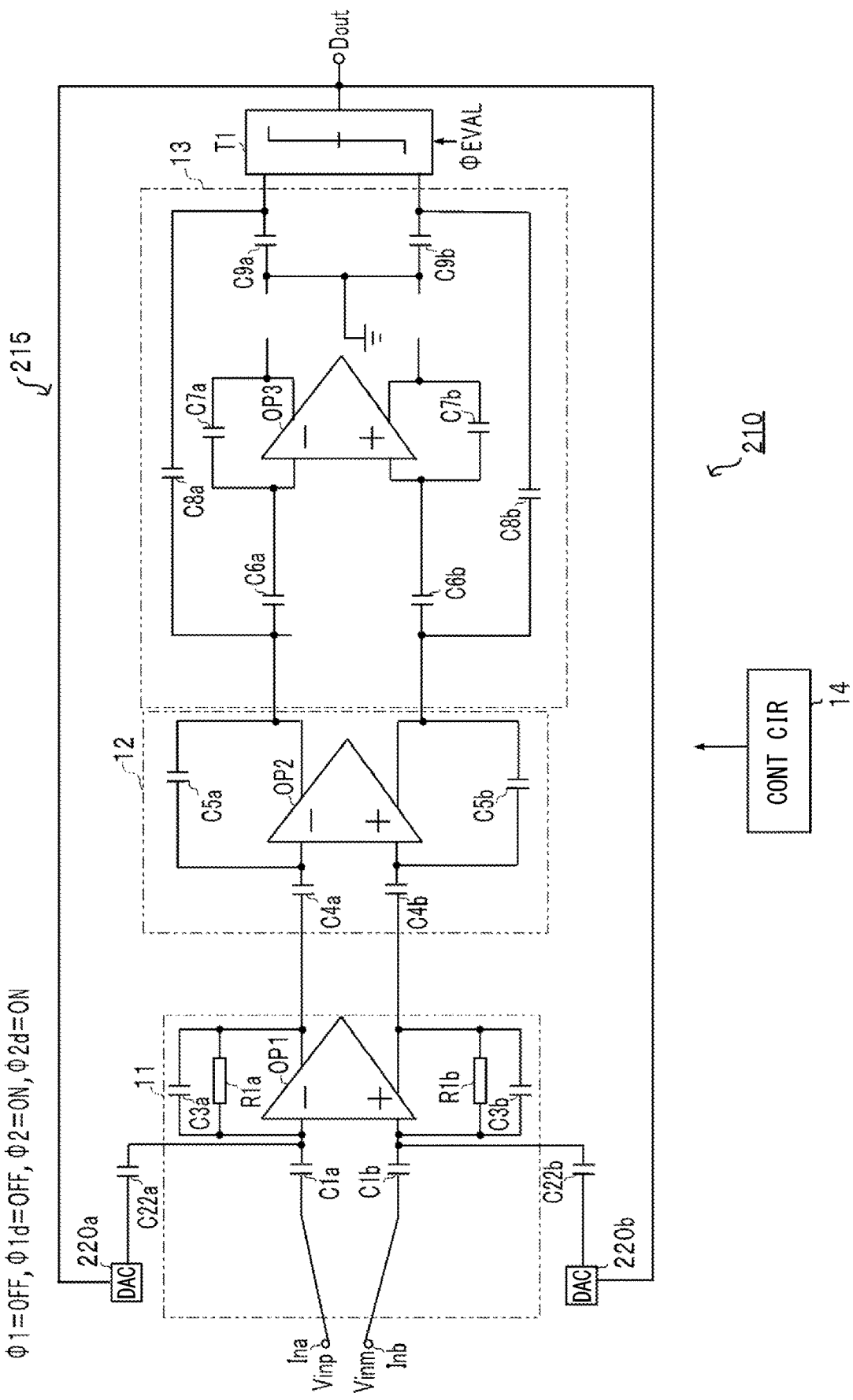
FIG. 8 is a circuit connection diagram at the time of feedback of the D/A converter showing the second embodiment.

A second embodiment will be described with reference to FIGS. 7 and 8. The difference between the A/D converter 210 shown in FIG. 7 and the first embodiment is that the D/A converters 220a and 220b are configured to feed back the output to the capacitively coupled amplifier 11. Further, the capacitively coupled amplifier 11 is configured in the feedback loop of the AZ modulator 215. The D/A converters 220a and 220b indicate the equivalent of the first D/A converter.

The delta-sigma modulator 215 includes a capacitively coupled amplifier 11, a first integrator 12, a second integrator 13, a quantizer T1, and D/A converters 220a and 220b. The output of the D/A converters 220a and 220b is fed back to the input terminal of the operational amplifier OP1 of the capacitively coupled amplifier 11 through the switches S24a and S24b and the capacitors C22a and C22b, respectively, with the high potential as +5V and the low potential as 0V, for example. The on/off control signal $\phi 2d$ shown in the above-described embodiment is given to the switches S24a and S24b. The other configurations are the same as those of the first embodiment. Then, as shown in FIG. 8, when the on/off control signals become the state of "$\phi 2$=ON" and "$\phi 2d$=ON", the capacitively coupled amplifier 11 also amplifies the feedback output by the D/A converters 220a and 220b together with the analog input signal of "Vinp–Vinm".

In this case, the influence of the variation of the feedback capacitances C3a and C3b of the capacitively coupled amplifier 11 and the influence of the variation of the capacitors C4a, C4b, C5a, C5b and the like configured in the first integrator 12 and the like in the subsequent stage are reduced, so that the gain error can be reduced.

When the D/A converters 20a and 20b output the absolute value obtained by D/A-converting the output value of the digital signal Dout of the quantizer T1 to a relatively small value, as shown in the first embodiment, when the feedback is given to the integrator 12, the DAC capacitance value constituting the first integrator 12 must be increased and designed. However, as in the present embodiment, by feeding back the output of the quantizer T1 to the capacitively coupled amplifier 11, it can be realized even if a small DAC capacitance is used because the capacitively coupled amplifier 11 amplifies.

Third Embodiment

Figure 9:
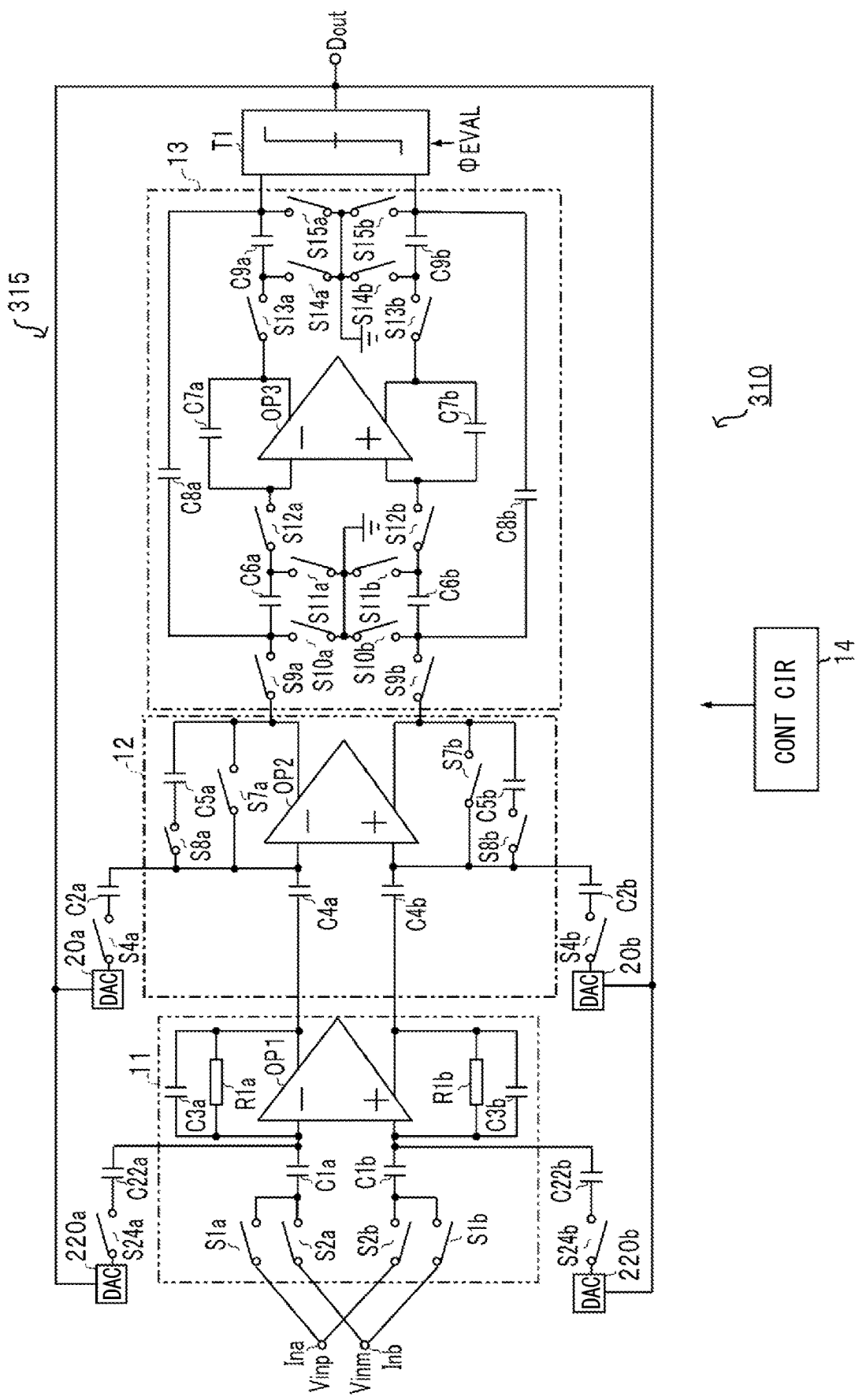
FIG. 9 is an electrical configuration diagram of an A/D converter showing a third embodiment.
Figure 10:
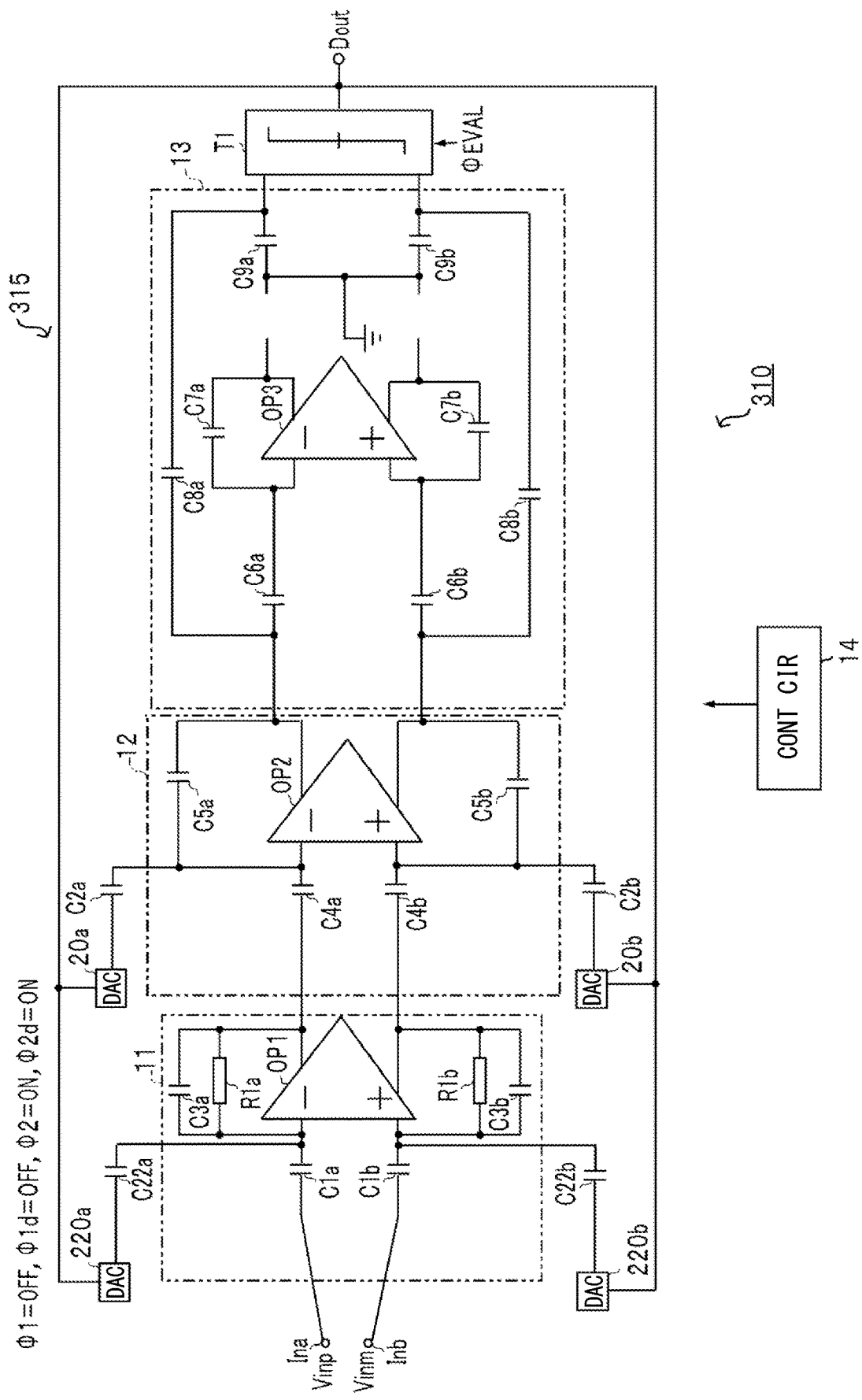
FIG. 10 is a circuit connection diagram at the time of feedback of the D/A converter showing the third embodiment.

A third embodiment will be described with reference to FIGS. 9 and 10. The difference between the ΔΣ modulator 315 shown in FIG. 9 and the AZ modulator 15 of the first embodiment is that the D/A converters 220a, 220b and 20a, 20b are arranged in both the capacitively coupled amplifier 11 and the first integrator 12. Further, the output is fed back to both the capacitively coupled amplifier 11 and the first integrator 12. Furthermore, another feature is that the capacitively coupled amplifier 11 is configured in the feedback loop of the AZ modulator 315.

The on/off control signal $\phi 2d$ shown in the above-described embodiment is given to the switches S4a, S4b, S24a and S24b. As shown in FIG. 10, when the on/off control signals become the state of "$\phi 2$=ON" and "$\phi 2d$=ON", the capacitively coupled amplifier 11 amplifies the feedback output by the D/A converters 220a and 220b together with the analog input signal of "Vinp–Vinm", and further, the first integrator 12 also amplifies the feedback output by the D/A converters 20a and 20b. As described above, according to the present embodiment, it has the same effect as that of the first embodiment and the same effect as that of the second embodiment.

Further, even if there is a difference in the feedback output values between the D/A converters 20a and 20b and the D/A converters 220a and 220b, it becomes easy to handle the situation. For example, the output values of the D/A converters 20a and 20b are defined as V1, the output values of the D/A converters 220a and 220b are defined as V2, and when an equation of "V1>V2" is satisfied, when both the output value V1 and the output value V2 are fed back and output to the first integrator 12, it may be necessary to increase the DAC capacity in order to increase the amplification degree on the output value V2 side. However, by feeding back the output value V2 to the capacitively coupled amplifier 11, it is not necessary to increase the DAC capacity by the amount amplified by the capacitively coupled amplifier 11.

Fourth Embodiment

Figure 11:
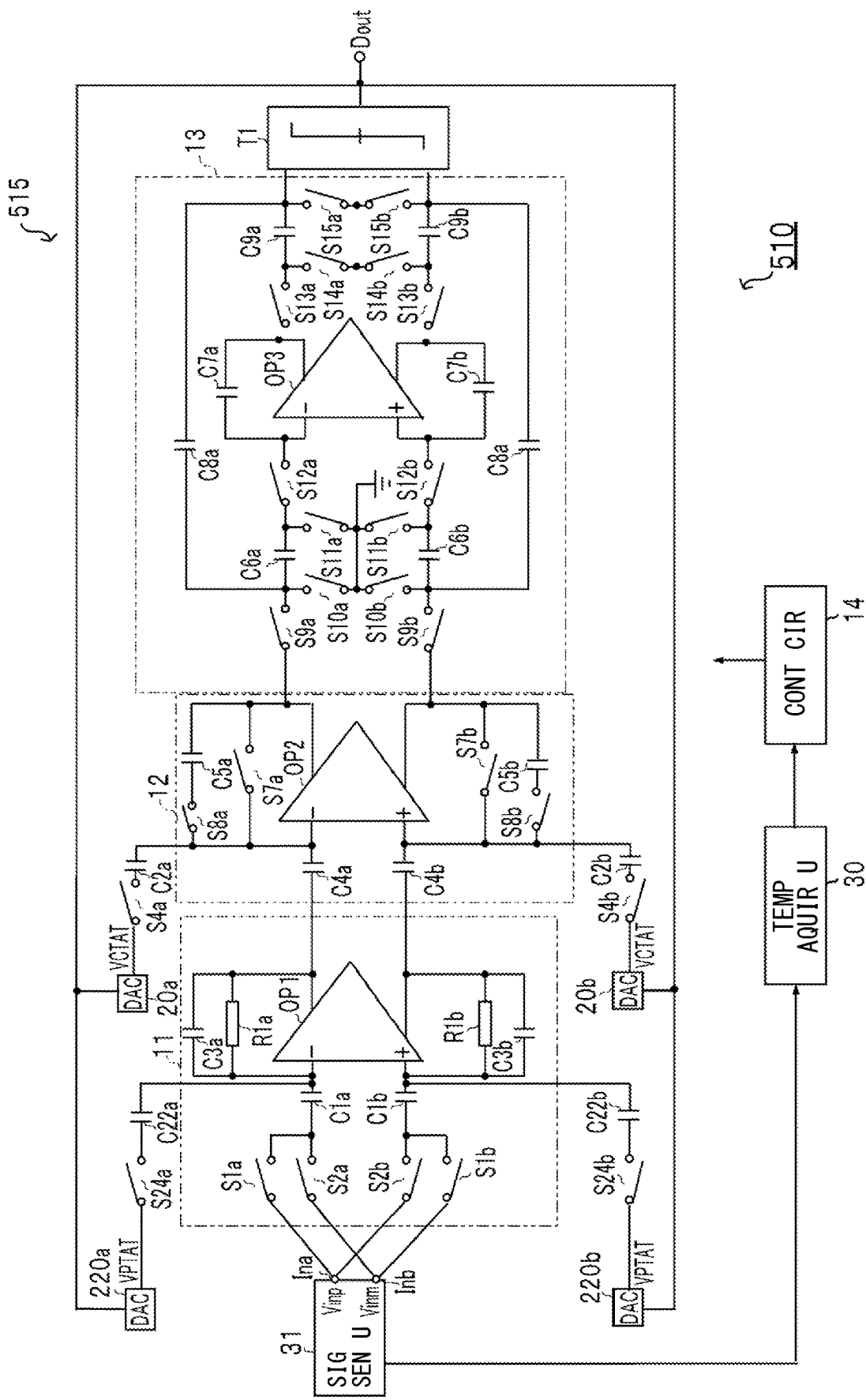
FIG. 11 is an electrical configuration diagram of an A/D converter showing a fourth embodiment.

A fourth embodiment will be described with reference to FIG. 11. The fourth embodiment differs from the first embodiment in that the plurality of sets of D/A converters 220a, 220b, 20a, and 20b output either the PTAT signal $V_{PTAT}$ that increase with temperature or CTAT signal $V_{CTAT}$ that decreases with temperature according to the temperature characteristics of the analog input signals Vinp and Vinp so that the temperature dependence is compensated. The D/A converters 220a, 220b, 20a, and 20b compensate for the temperature dependence by outputting the PTAT signal $V_{PTAT}$ or the CTAT signal $V_{CTAT}$ and adjusting the feedback amount.

When the analog input signals Vinp and Vinm change depending on the temperature, for example, increase or decrease with temperature, it may be desirable to correct this temperature dependence. In such a case, it may be preferable to provide a temperature acquisition unit 30 for acquiring a signal (for example, voltage or current) depending on the environmental temperature of the source of the analog input signals Vinp and Vinm. For example, when the source of the analog input signals Vinp and Vinm is a signal sensing unit 31 such as a pressure sensor or a current sensor using a shunt resistor, the analog input signals Vinp and Vinm change depending on the ambient temperature. In such a case, it may be preferable to provide the temperature acquisition unit 30 so as to acquire the temperature of the signal sensing unit 31.

The D/A converters 220a, 220b, 20a, and 20b multiply the output of the digital signal Dout of the quantizer T1 by the PTAT signal $V_{PTAT}$ or the CTAT signal $V_{CTAT}$ and output and feeds back. For example, by applying a constant current to the first diode and using the voltage as the acquisition value, a CTAT signal $V_{CTAT}$ depending on the temperature characteristics of the first diode is generated, and a constant current different from that is passed through the second diode so that the PTAT signal $V_{PTAT}$ is generated by calculating the voltage difference between the first diode and the second diode.

When it is known that the analog input signals Vinp and Vinm depend on the temperature T acquired by the temperature acquisition unit 30, the D/A converters 220a and 220b output by multiplying the PTAT signal $V_{PTAT}$ depending on the temperature and the digital signal Dout of the quantizer T1, and the D/A converters 20a and 20b output by multiplying the CTAT signal $V_{CTAT}$ and the digital signal Dout of the quantizer T1.

The temperature components can be canceled by the D/A converters 220a, 220b, 20a, and 20b feeding back in the same temperature dependence as the analog input signals Vinp and Vinm. When there is a relationship of "Vinp−Vinm=kT", where k is the temperature dependence coefficient and T is the temperature, if an equation of:

$$Vref = V_{PTA}T + V_{CTAT}/\alpha$$
$$= k'T - k''T/\alpha = kT$$

is satisfied, the influence of the change in temperature T can be compensated.

Here, the coefficients k' and k'' indicate the temperature dependence coefficient of the PTAT signal $V_{PTAT}$ and the CTAT signal $V_{CTAT}$, that is, the coefficient of the slope with respect to the increase or decrease in temperature, respectively. Further, the coefficient α indicates a coefficient based on the input capacitance and the feedback capacitance ratio of the capacitively coupled amplifier 11, the DAC capacitance of the D/A converters 20a and 20b, and the feedback capacitance ratio of the first integrator 12.

The capacitance value of the capacitors C1a and C1b which are the input capacitances of the capacitively coupled amplifier 11 is defined as Cin, and the capacitance value of the capacitors C3a and C3b which are the feedback capacitances is defined as Cfb. Further, the capacitance values of the capacitors C2a and C2b, which are the output DAC capacitances of the D/A converters 20a and 20b, are set to Cdac, and the capacitance values of the capacitors C4a and C4b, which are the input capacitances of the first integrator 12, are set to Cin2. The coefficient α can be expressed by an equation of "α=(Cin/Cfb)×(Cin2/Cdac)". By setting in this way, the influence of the change in the environmental temperature T can be compensated.

Fifth Embodiment

Figure 12:
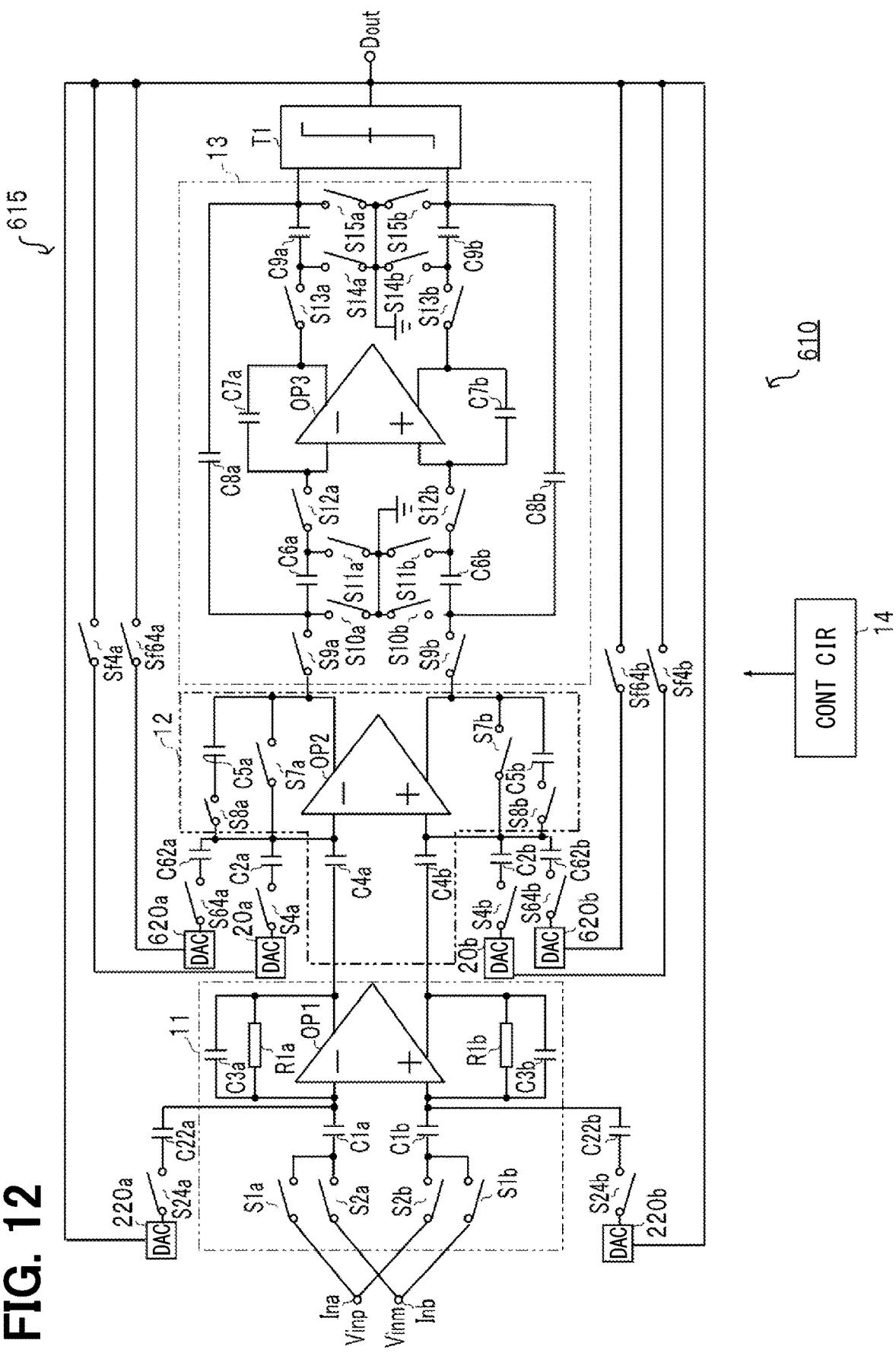
FIG. 12 is an electrical configuration diagram of an A/D converter showing a fifth embodiment.

A fifth embodiment will be described with reference to FIG. 12. As shown in FIG. 12, a series connection circuit of the D/A converter 620a, the switch S64a, and the capacitor C62a is connected in parallel with the series connection circuit of the D/A converter 20a, the switch S4a, and the capacitor C2a. Further, a switch Sf64a is connected between the output of the quantizer 5 and the input of the D/A converter 20a. The switches S4a and S64a are controlled to be turned on and off in synchronization.

On the other hand, the series connection circuit of the D/A converter 620b, the switch S64b, and the capacitor C62b is connected in parallel with the series connection circuit of the D/A converter 20b, the switch S4b, and the capacitor C2b. Further, a switch Sf64b is connected between the output of the quantizer 5 and the input of the D/A converter 20b. The switches S4b and S64b are controlled to be turned on and off in synchronization. The D/A converters 620a and 620b correspond to the third D/A converter according to the present embodiment.

When the analog input signal of "Vinp−Vinm2 has temperature dependence for a plurality of parameters, it may be desirable to switch a plurality of feedback paths for the dependence coefficients k1 and k2 of the respective parameters to compensate the temperature dependence.

When a relationship of "Vinp−Vinm=k1·T" is provided for the dependency coefficient k1, if an equation of "Vref=$V_{PTAT}$+$V_{CTAT}$/α=(k'·T)−(k''·T/α)=k1·T" is satisfied, the dependence due to the temperature T can be compensated. Here, the capacitance values of the capacitors C2a and C2b as the DAC capacitance connected in series to the D/A converters 20a and 20b are defined as Cdac1, an equation of "α=(Cin/Cfb)×(Cin2/Cdac1) is satisfied as in the fifth embodiment.

On the other hand, when a relationship of "Vinp−Vinm=k2·T" is provided for the dependency coefficient k2, if an equation of "Vref=$V_{PTAT}$+$V_{CTAT}$/λ=(k'T)−(k"T/λ) =k2·T" is satisfied, the temperature component can be cancelled.

The capacitance values of the capacitors C62a and C62b as the DAC capacitance connected in series to the D/A converters 620a and 620b are defined as Cdac2, and an equation of "λ=(Cin/Cfb)×(Cin2/Cdac2)" is satisfied. Therefore, even if the analog input signal of "Vinp−Vinm" changes depending on the temperature according to a plurality of parameters, the above-mentioned a and A are set and the respective capacitor capacitances are adjusted, and the feedback amount is adjusted for each feedback path. Thus, the compensation amount of the dependence of the temperature T can be adjusted. Thereby, the dependency of the temperature T based on a plurality of parameters can be decomposed into elements, and the circuit constant of the independent feedback path can be determined to adjust the compensation amount of the dependency of the temperature T for each element.

For example, when the temperature compensation of the analog input signal of "Vinp−Vinm" is roughly adjusted by the feedback of the D/A converters 620a and 620b, and further, the temperature compensation of the analog input signal of "Vinp−Vinm" is finely adjusted by the feedback of the D/A converters 20a and 20b, the range for the temperature compensation can be further expanded as compared with the fifth embodiment. Moreover, if the capacity can be made variable, it is possible to make fine adjustments.
(Modification)

Hereinafter, modified examples of the fourth and fifth embodiments will be described. Any combination of the D/A converters 20a, 20b, 220a, 220b, 620a, and 620b described in the fourth and fifth embodiments may be used. For example, the relationship of the output voltage based on the PTAT signal $V_{PTAT}$ and the CMAT signal $V_{CTAT}$ by the D/A converters 20a, 20b, 220a, 220b described in the fourth embodiment may be replaced.

If the direction of the dependence of the temperature T of the analog input signals Vinp and Vinm is known in advance, each of the D/A converters 20a, 20b, 220a, 220b, 620a, and 620b may output the voltage prepared by multiplying the output of the quantizer T1 and the PTAT signal $V_{PTAT}$, or may output the voltage prepared by multiplying the output of the quantizer T1 and the CMAT signal $V_{CTAT}$.

When each of the D/A converters 20a, 20b, 620a, and 620b described in the fifth embodiment output a voltage using, for example, the PTAT signal $V_{PTAT}$, one of the D/A converters (for example, 20a, 20a) may roughly adjusts the voltage based on this PTAT signal $V_{PTAT}$ and changes the voltage in a stepwise manner, and the other D/A converters (for example, 620a, 620b) may finely adjusts the voltage based on the PTAT signal $V_{PTAT}$. The same applies to the case where the voltage is output by using the CTAT signal $V_{CTAT}$.

The configuration in which two D/A converters 20a, 20b, 620a, and 620b are provided in parallel has been described, alternatively, three or more D/A converters may be configured in parallel, and the degree of change in the output of the D/A converter may be adjusted step by step.

Similarly, when each of the D/A converters 20a, 20b, 620a, and 620b described in the fifth embodiment outputs a voltage using, for example, the PTAT signal $V_{PTAT}$, only one of the D/A converters 20a, 20b, 620a, and 620b may be switched to output a voltage by using the CTAT signal $V_{CTAT}$.

Further, when each of the D/A converters 20a, 20b, 220a, and 220b described in the fourth embodiment outputs a voltage using, for example, the PTAT signal $V_{PTAT}$, only one of the D/A converters 20a, 20b, 220a, 220b may be switched to output a voltage by using the CTAT signal $V_{CTAT}$, or each of the converters may output the voltage by using the CTAT signal $V_{CTAT}$.

Sixth Embodiment

The sixth embodiment will be described with reference to FIGS. 13A and 13B. In the sixth embodiment, the D/A converters 20a, 20b, 220a, 220b are configured to have a feedback amount adjustment circuit 30a, 30b, 630a, 630b which adjusts the feedback amount for each of the quantization result by the quantizer T1 that is performed by the bit stream controlled method. Further, the output of the D/A converters 20a, 20b is determined according to the feedback amount adjustment circuit 30a, 30b, 630a, 630b.

In the first to fifth embodiments, the D/A converters 20a, 20b have one output, e.g., a high potential output or a low potential output such as one of outputs +5V and −5V with respect to one output value "1" or "0" of the digital signal Dout. That is, each time the digital signal Dout is output, the D/A converters 20a and 20b output once.

Figure 13A:
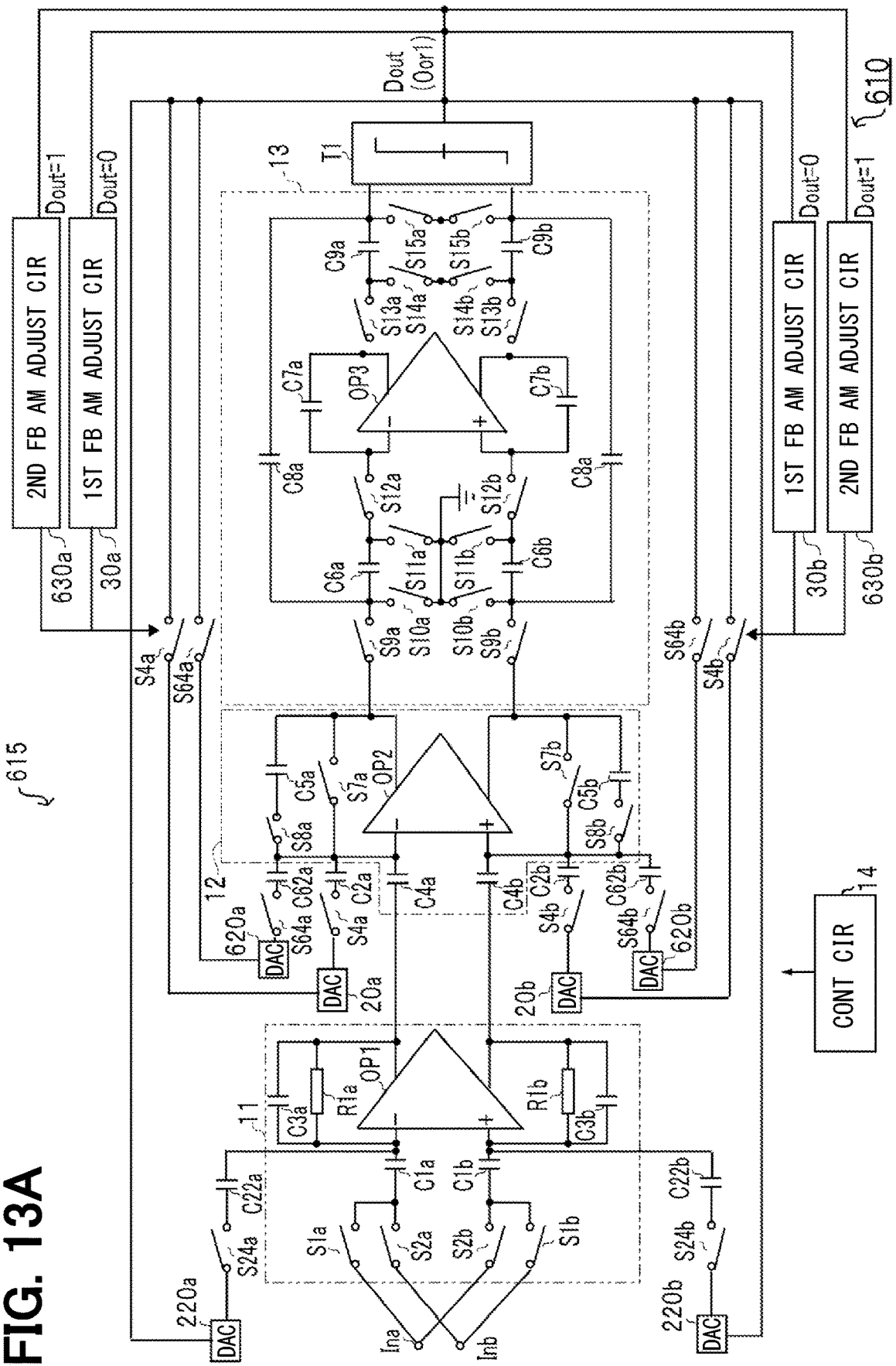
FIG. 13A is an electrical configuration diagram of an A/D converter showing a sixth embodiment.

In the present embodiment, as shown in FIG. 13A, the feedback amount adjustment circuits 30a, 30b, 630a, 630b for adjusting the feedback amount are arranged at the output destination of the quantizer T1, and the D/A converters 20a, 20b, 630a, and 630b output a voltage corresponding to the output of each of the feedback amount adjustment circuits 30a, 30b, 630a, and 630b. The feedback amount adjustment circuits 30a, 30b, 630a, and 630b are provided for each quantization result of the quantizer T1. For example, when the digital signal Dout of the output of the modulator T1 is a 2-bit output of 0 or 1, and when a signal of "Dout=0" is output, it is input to the first feedback amount adjustment circuits 30a and 30b, and when a signal of "Dout=1" is output, it is input to the second feedback amount adjustment circuits 630a and 630b. Digital processing is performed in a separate feedback amount adjustment circuit for each digital signal Dout. After that, the outputs of the D/A converters 20a, 20b, 630a, and 630b are determined according to the outputs of the feedback amount adjustment circuits 30a, 30b, 630a, and 630b.

As a specific example of FIG. 13A, for example, the feedback amount adjustment circuits 30a, 30b, 630a, and 630b have a configuration in which the DAC output is determined by ΔΣ modulation of the output of the quantizer T1. FIG. 13B shows an example in which the feedback amount adjustment circuits 30a, 30b, 630a, and 630b apply the ΔΣ modulation. As illustrated in the upper part of FIG. 13B, when the amplification factor of the feedback amount is 1 and bit stream control is not performed, and when the digital signal Dout is "1", the D/A converters 20a and 20b output a high potential, for example, +5V as an analog signal. When the digital signal Dout is "0", the D/A converters 20a and 20b output a low potential, for example, −5V as one analog signal.

On the other hand, as illustrated in the middle of FIG. 13B, when the amplification factor of the feedback amount is ½, and when the previous digital signal Dout of "1" immediately before is output twice, the D/A converters 20a and 20b output a medium potential of, for example, 0V once as an analog signal, and output a high potential of 5V once as an analog signal. Conversely, when the previous digital signal Dout of "0" immediately before is output twice, the D/A converters 20a and 20b output a medium potential of 0V once as an analog signal, and output a low potential of −5V once as an analog signal.

Similarly, as illustrated in the lower part of FIG. 13B, when the amplification factor of the feedback amount is ⅓, and when the previous digital signal Dout of "1" immediately before is output three times, the D/A converters 20a and 20b output a medium potential of, for example, 0V twice as an analog signal, and output a high potential of 5V once as an analog signal. Conversely, when the previous digital signal Dout of "0" immediately before is output three times, the D/A converters 20a and 20b output a medium potential of 0V twice as an analog signal, and output a low potential of −5V once as an analog signal.

According to this embodiment, the feedback amount can be appropriately adjusted only by changing the digital processing without changing the analog circuit configuration. The feedback amount can be roughly adjusted or finely adjusted only by changing the amplification factor of the feedback amount shown above. Utilizing this feature, for example, the rough adjustment or fine adjustment can be switched and performed when correcting the feedback amount based on the acquired temperature.

Seventh Embodiment

A seventh embodiment will be described with reference to FIG. 14. In the first embodiment, the feedback configuration is a CIFF configuration, but as shown in the A/D conversion device 710 of FIG. 14, a CIFB configuration may also be used. The difference between the A/D converter 710 and the A/D converter 10 is that the configuration of the second integrator 713 and the D/A converter 720a feed back to the second integrator 713.

Figure 14:
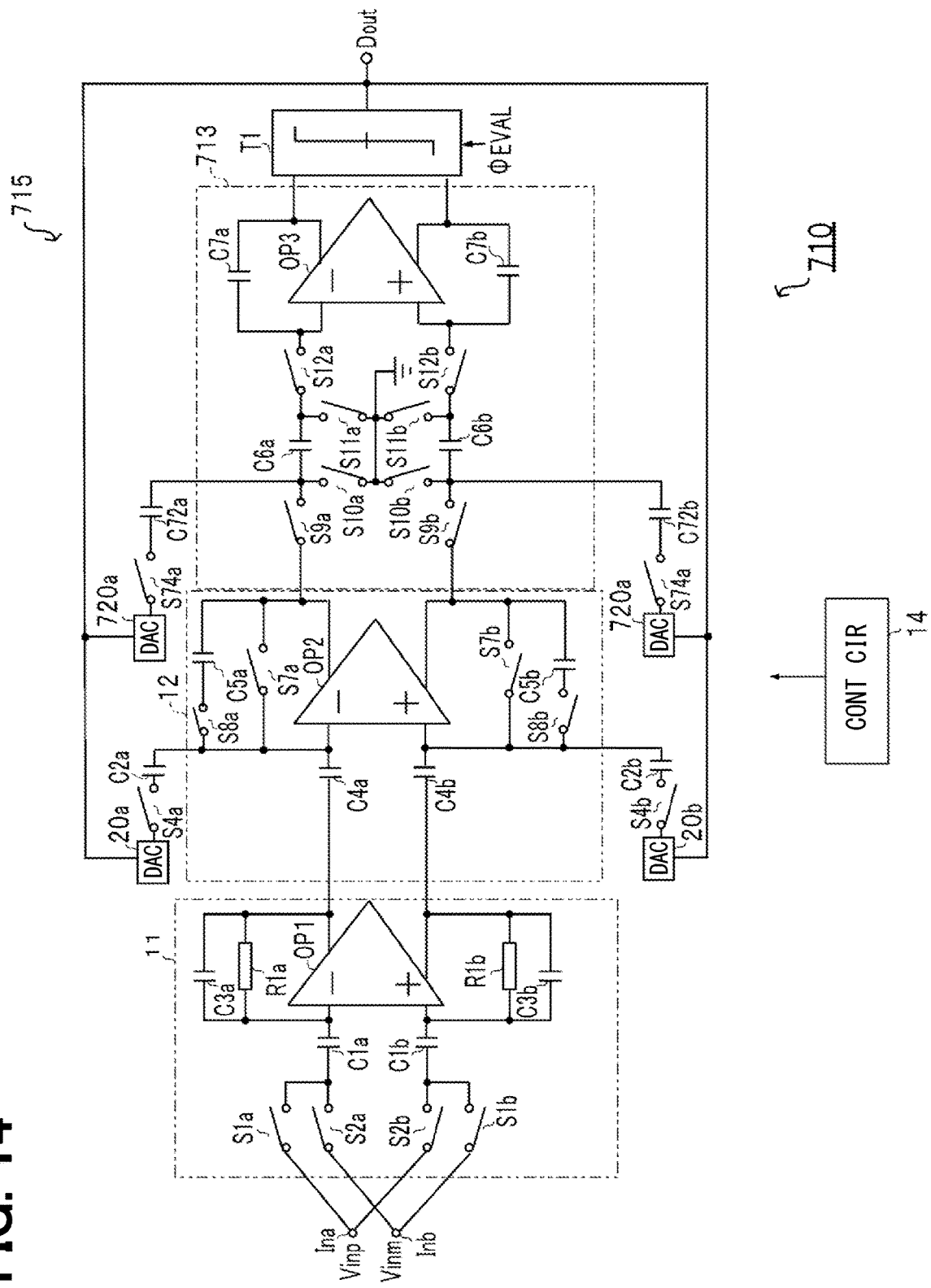
FIG. 14 is an electrical configuration diagram of an A/D converter showing a seventh embodiment.

The A/D converter 710 shown in FIG. 14 has the configuration such that the capacitors C9a and C9b and the switches S13a to S15a configured in the output of the operational amplifier OP3 of the A/D conversion device 10 are deleted, and the capacitors C8a and C8b, which are feedback capacitances of the second integrator 13, as the second integrator 713 are deleted, and the output of the operational amplifier OP3 and the input of the quantizer T1 are directly connected to each other.

Further, the D/A converters 720a and 720b feed back the digital signal Dout output by the quantizer T1 to the second integrator 713 through the switch S74a and the capacitor C72a. As a result, the capacitors C9a and C9b and the switches S13a to S15a used in the CIFF configuration can be reduced. As a result, the constituent area of the capacitor and the switch can be reduced, and the overall size can be reduced.

Eighth Embodiment

An eighth embodiment will be described with reference to FIGS. 15 to 19. The delta-sigma modulator 815 shown in FIG. 15 has polarity inversion circuits X1 (X1a, X1b), X2 (X2a, X2b), X3 (X3a, X3b), X4 (X4a, X4b) for chopping before and after input/output. In addition, an inversion circuit X5 with a control terminal is provided.

Figure 15:
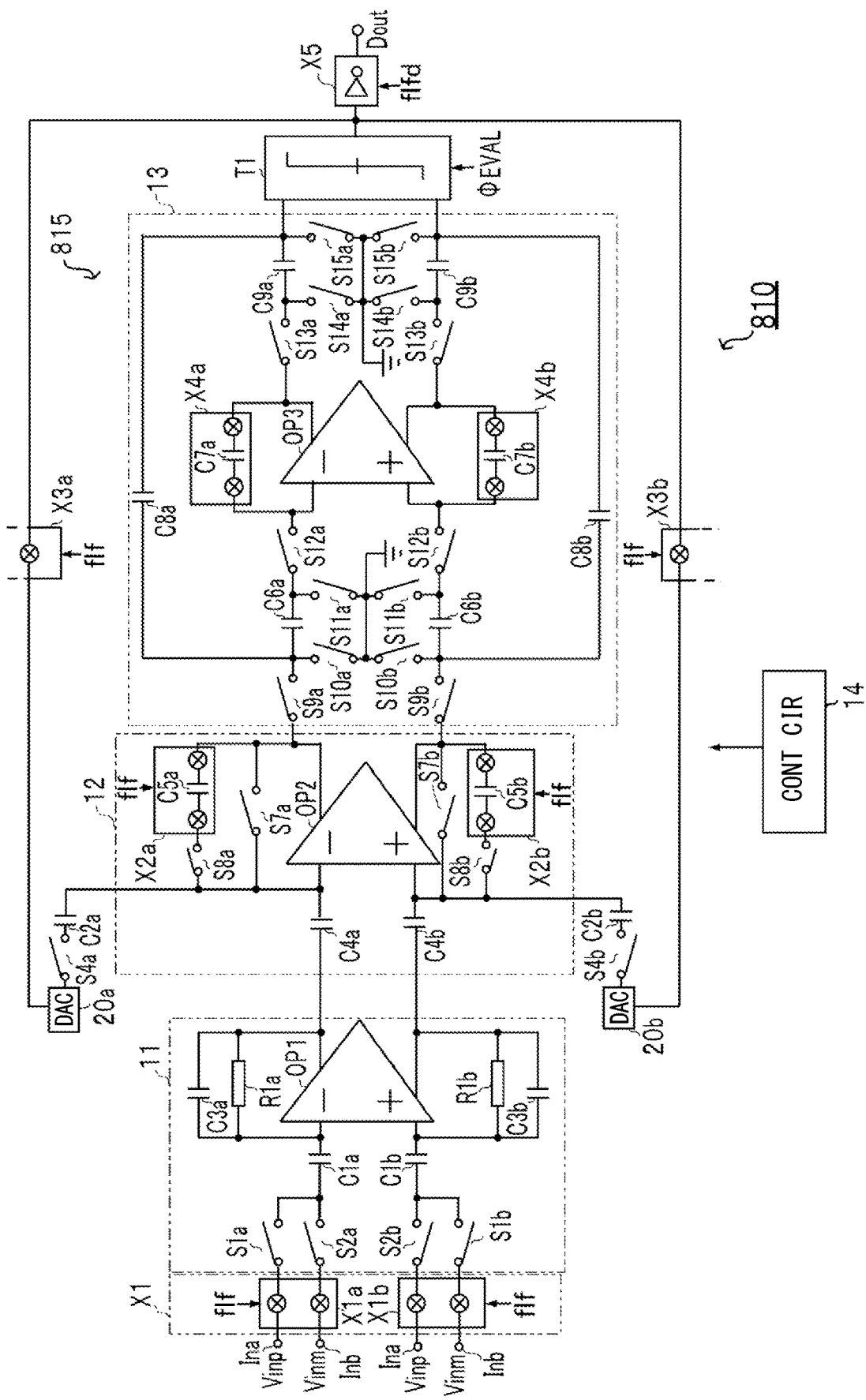
FIG. 15 is an electrical configuration diagram of an A/D converter showing a eighth embodiment.
Figure 16:
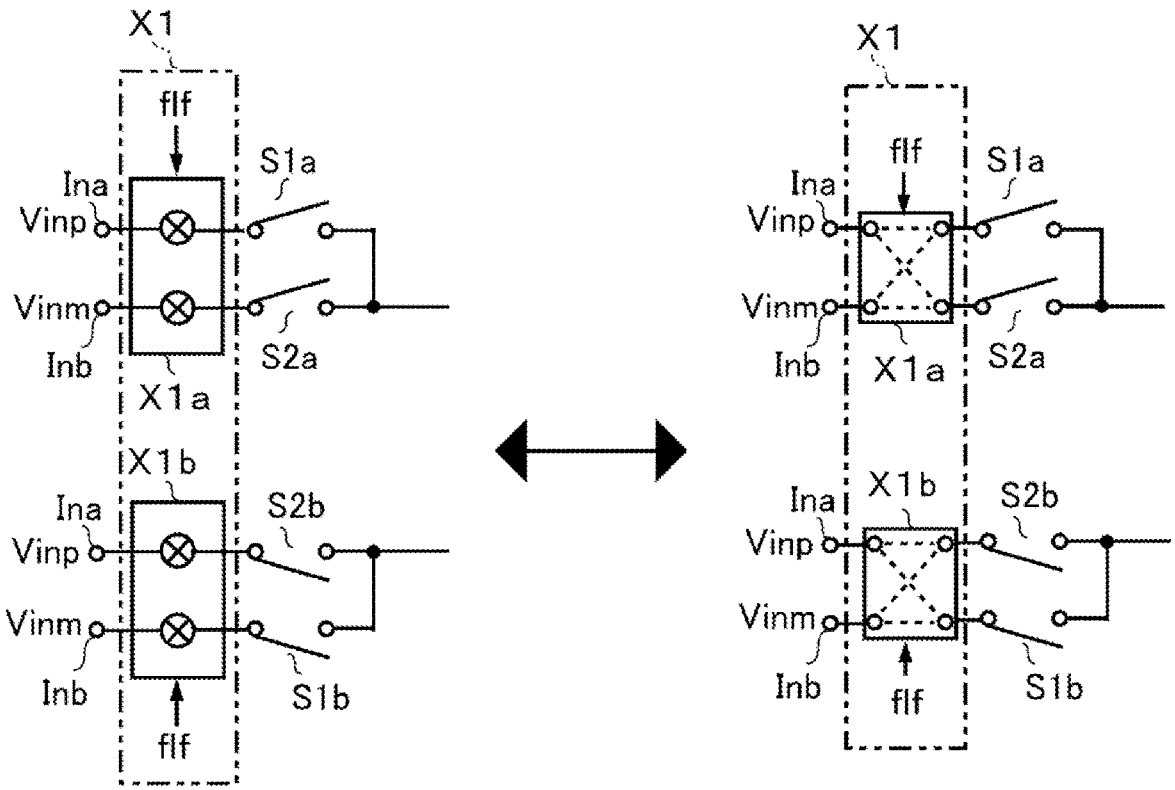
FIG. 16 is an equivalent circuit diagram of a polarity conversion switch showing an eighth embodiment.

The polarity inversion circuits X1 (X1a, X1b), X2 (X2a, X2b), X3 (X3a, X3b), and X4 (X4a, X4b) shown in FIG. 15 are circuits equivalent to the polarity inversion circuits X1 to X4 shown in FIGS. 16 to 19, respectively. The polarity inversion circuit X1 shown in FIG. 16 is configured to be arranged immediately after the input terminals Ina and Inb by using the switches X1a and X1b for switching the straight/cross connection of the wiring, and by inputting the polarity inversion signal flf, the analog input signal Vinp and Vinm can be switched. As a result, the input unit for inputting the analog input signals Vinp and Vinm is configured to perform chopping operation.

Figure 17:
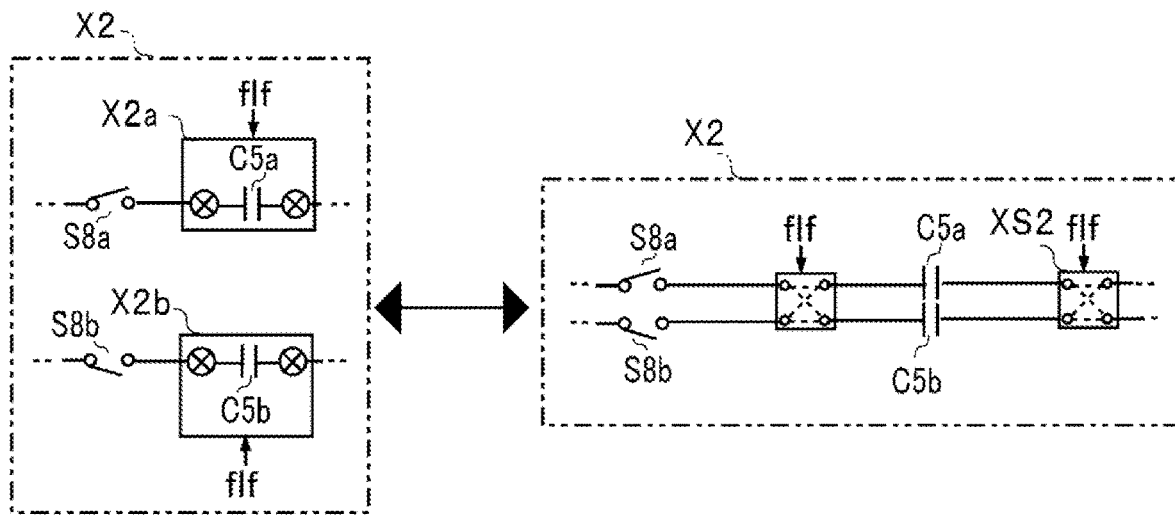
FIG. 17 is an equivalent circuit diagram of a polarity conversion switch showing an eighth embodiment.

The polarity inversion circuit X2 shown in FIG. 17 is a circuit for switching the series wiring connection between the capacitors C5a and C5b and the switches S8a and S8b by using a switch (no reference numeral) for switching the straight/cross connection of the wiring, and the connection can be switched by inputting the polarity inversion signal flf. As a result, the chopping operation is performed before and after the feedback capacitance of the first integrator 12.

Figure 18:
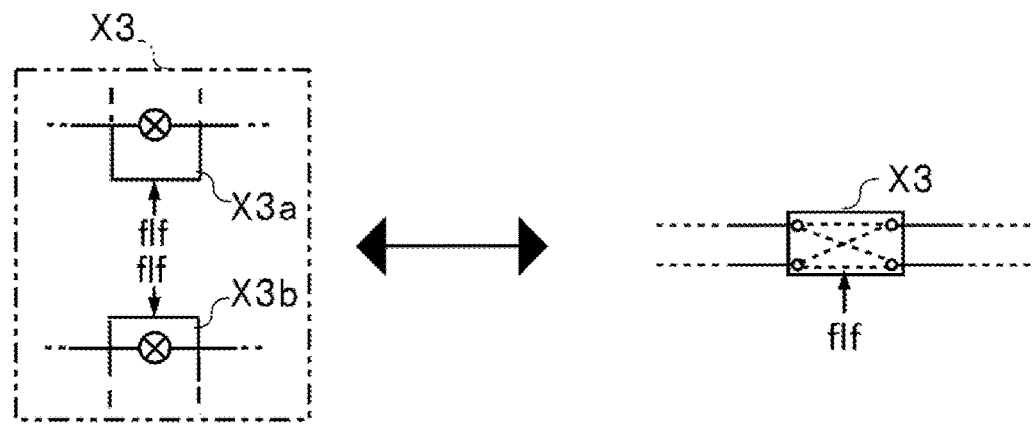
FIG. 18 is an equivalent circuit diagram of a polarity conversion switch showing an eighth embodiment.

The polarity inversion circuit X3 shown in FIG. 18 is a circuit that switches a feedback path from the output of the quantizer T1 to the inputs of the D/A converters 20a and 20b by using a switch for switching the straight/cross connection of the wiring. The connection can be switched by inputting the polarity inversion signal flf. As a result, the input units of the D/A converters 20a and 20b for feeding back the output of the digital signal Dout are configured to perform a chopping operation.

Figure 19:
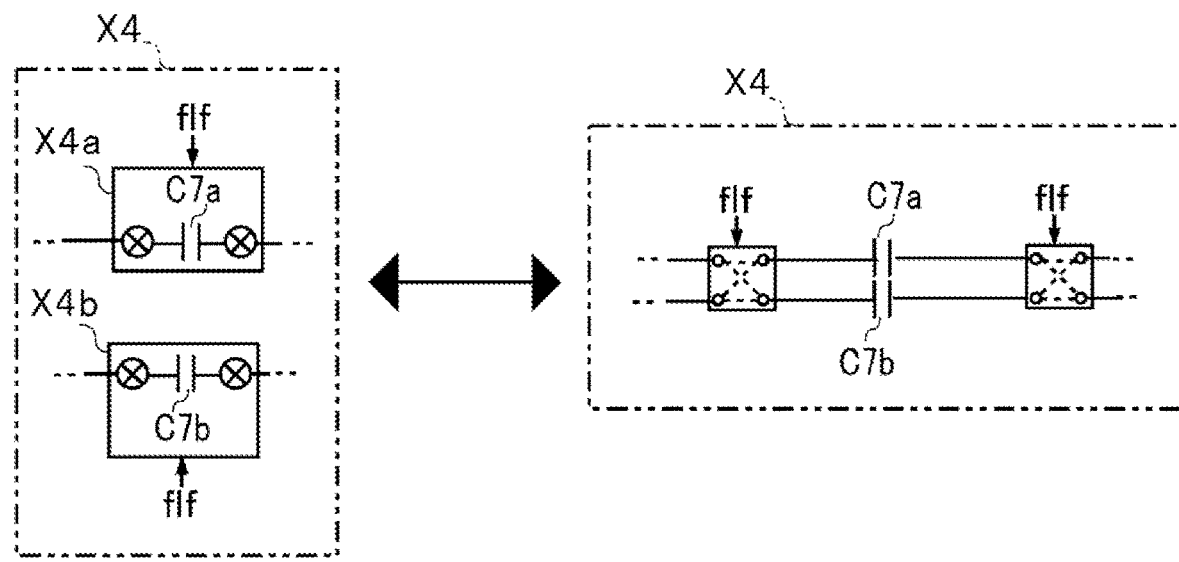
FIG. 19 is an equivalent circuit diagram of a polarity conversion switch showing an eighth embodiment.

The polarity inversion circuit X4 shown in FIG. 19 is a circuit for switching the wiring connection of the capacitors C7a and C7b by using a switch (no reference numeral) for switching the straight/cross connection of the wiring, and the connection can be switched by inputting the polarity inversion signal flf. As a result, the chopping operation is performed before and after the feedback capacitance of the second integrator 13.

Further, the inversion circuit X5 with a control terminal shown in FIG. 15 is a circuit capable of switching between normal output and inversion output by inputting a polarity inversion signal flfd.

The control circuit 14 can switch the connection by sequentially switching the straight/cross connection of the switches X1a, X1b, X2, X3, and X4 using the polarity inversion signals flf and flfd. Further, the control circuit 14 is configured to switch between the normal output and the inversion output by switching an available state and an unavailable state of the inversion circuit X5 using the polarity inversion signal flfd. The latter stage of the output unit of the quantizer T1 is configured to perform chopping operation.

Figure 20:
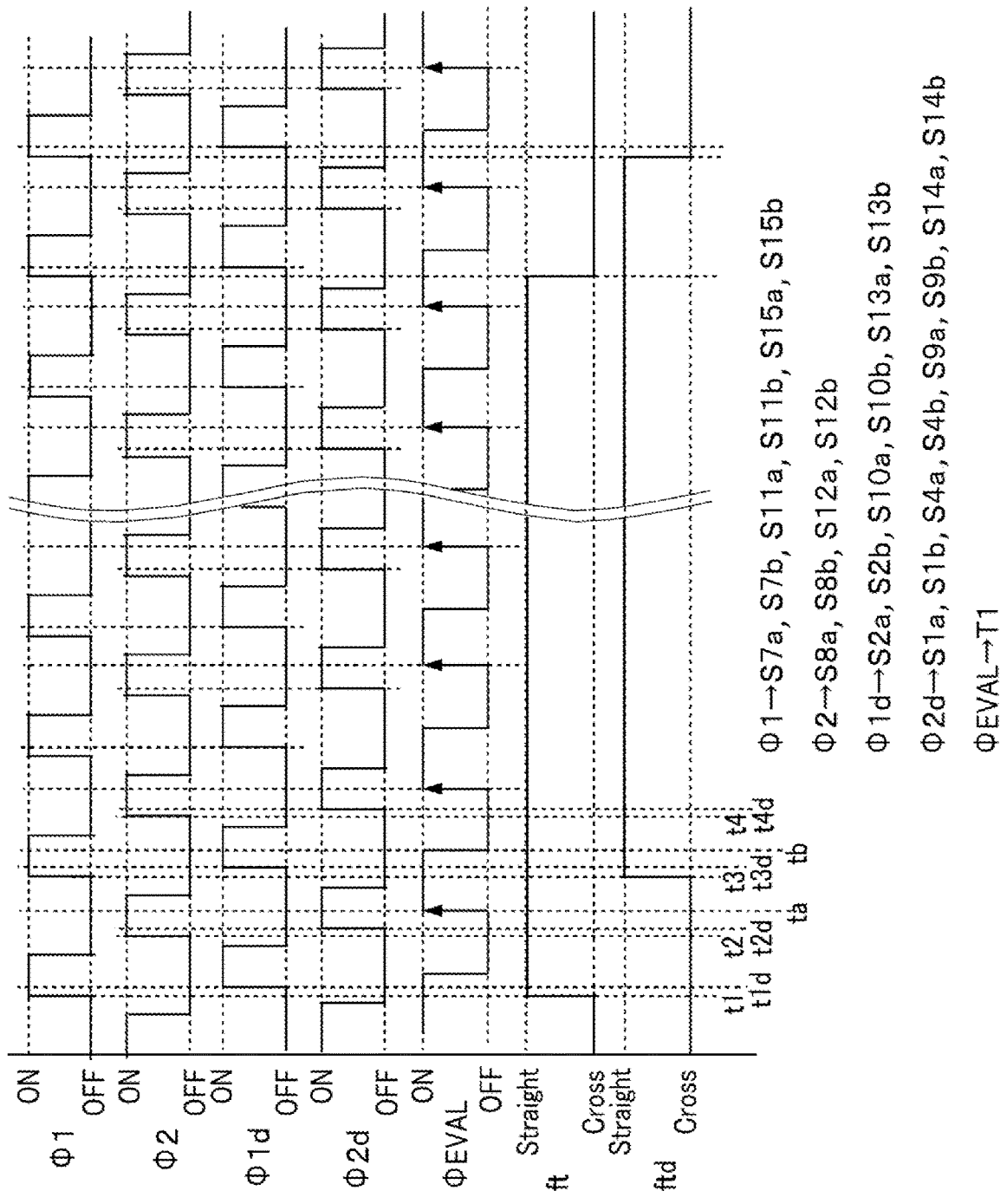
FIG. 20 is an example diagram of a control signal applied to each configuration for the eighth embodiment.

The control circuit 14 switches the straight/cross connection of the polarity inversion circuits X1 to X4 by changing the polarity inversion signals flf and flfd as shown in FIG. 20, and controls the polarity inversion by switching the normal output and the inversion output of the inversion circuit X5.

At this time, only the chopping operation in the subsequent stage of the output unit of the quantizer T1 by the inversion circuit X5 is configured to operate by the polarity inversion signal flfd. This chopping operation is controlled so as to be delayed by one AD conversion timing from the chopping operation in the input unit of the analog input signals Vinp and Vinm by the other polarity inversion circuits X1 to X4, the chopping operation before and after the feedback capacitances of the first integrator 12 and the second integrator 13, and the chopping operation of the input unit of the D/A converters 20a and 20b for feeding back the output of the digital signal Dout.

The control circuit 14 repeats $2^n$ times, for example, 4 times, 8 times, . . . , 128 times, 256 times when the polarity inversion signal flf is an instruction for straight connection, and then, further repeats $2^n$ times with inverting the polarity when the polarity inversion signal flf is an instruction for cross connection. These processes will be repeated sequentially.

As described above, by repeating charging and discharging of the capacitor, the capacitively coupled amplifier 11 amplifies the analog input signals Vinp and Vinm, and the first integrator 12 integrates and outputs the output charge. After that, by inverting the connection using the polarity inversion circuits X1 to X4, the charge based on the offset input in the forward direction to the capacitor can be discharged in the reverse direction. Then, the offset accumulated sequentially by repeating $2^n$ times can be cancelled by repeating $2^n$ times reversely, and the influence of the offset can be further reduced as compared with the configuration of the above-described embodiment.

Further, according to the present embodiment, the degree of freedom of the acquisition timing by the quantizer T1 (i.e., the comparator) can be increased. The settling time at this time can be secured.

Other Embodiments

The present disclosure is not limited to the embodiment described above, and, for example, may be modified or expanded, which will be described.

The configurations and functions of the plural embodiments described above may be combined. A part of the above-described embodiment may be omitted as long as the difficulty is resolvable, and may provide an example embodiment. In addition, various modifications of the present disclosure may be considered as encompassed in the present disclosure, as long as such modifications pertain to the gist of the present disclosure.

The present disclosure has been described in accordance with the embodiments. However, it is to be understood that the present disclosure is not limited to the embodiments and structure. The present disclosure covers various modification examples and equivalents thereof. In addition, various modes/combinations, one or more elements added/subtracted thereto/therefrom, may also be considered as the present disclosure and understood as the technical thought thereof.

In the drawing, 11 is a capacitively coupled amplifier, 12 is a first integrator, 13 is a second integrator, 20a and 20b are D/A converters (i.e., second D/A converters), and 220a and 220b are D/A converters (i.e., first D/A converters), 620a and 620b are D/A converters (i.e., third D/A converters), 30 is the temperature acquisition unit, T1 is the quantizer, and OP1 to OP3 are operational amplifiers (i.e., AMP).

The controllers and methods described in the present disclosure may be implemented by a special purpose computer created by configuring a memory and a processor programmed to execute one or more particular functions embodied in computer programs. Alternatively, the controllers and methods described in the present disclosure may be implemented by a special purpose computer created by configuring a processor provided by one or more special purpose hardware logic circuits. Alternatively, the controllers and methods described in the present disclosure may be implemented by one or more special purpose computers created by configuring a combination of a memory and a processor programmed to execute one or more particular functions and a processor provided by one or more hardware logic circuits. The computer programs may be stored, as instructions being executed by a computer, in a tangible non-transitory computer-readable medium.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A delta-sigma modulation type A/D converter that digitally converts an analog input signal, the A/D converter comprising:
    a capacitively coupled amplifier having a sampling capacitor, a feedback capacitor, and an amplifier, and amplifying the analog input signal;
    a correlated double sampling type first integrator that is disposed after the capacitively coupled amplifier, as a first-stage integrator, wherein an output of the capacitively coupled amplifier and an input of the sampling capacitor of the first integrator are directly connected to each other without a switch;
    a second integrator arranged after the first integrator;
    a quantizer arranged after the second integrator and quantizing an output of the second integrator; and
    an D/A converter that D/A-converts an output of the quantizer and feeds back to any one of the capacitively coupled amplifier, the first integrator, and the second integrator.

2. The delta-sigma modulation type A/D converter according to claim 1, wherein:
    the D/A converter is configured to feed back the output to the capacitive coupled amplifier.

3. The delta-sigma modulation type A/D converter according to claim 1, wherein:
    the D/A converter includes: a first D/A converter that feeds back the output of the quantizer to the capacitively coupled amplifier; and a second D/A converter that feeds back the output of the quantizer to the first integrator.

4. The delta-sigma modulation type A/D converter according to claim 3, further comprising:
    a temperature acquisition unit that acquires temperature, wherein:
    the first D/A converter is configured to output a voltage that increases with the temperature and feed back to the capacitively coupled amplifier;
    the second D/A converter is configured to output a voltage that decreases with the temperature and feed back to the first integrator; and
    a temperature compensation amount is adjusted by adjusting a feedback amount of the second D/A converter.

5. The delta-sigma modulation type A/D converter according to claim 4, wherein:
    the D/A converter includes: the first D/A converter; the second D/A converter; and a third D/A converter that feeds back the output of the quantizer to the first integrator;
    the third D/A converter is configured to output a voltage that decreases with the temperature and feed back to the first integrator; and
    the temperature compensation amount of an input signal is roughly adjusted by adjusting a feedback amount of the third D/A converter.

6. The delta-sigma modulation type A/D converter according to claim 3, further comprising:

a feedback amount adjustment circuit that adjusts a feedback amount of the second D/A converter for each quantization result of the quantizer; and a mechanism that determines an output voltage of the second D/A converter according to the feedback amount adjustment circuit.

7. The delta-sigma modulation type A/D converter according to claim 1, wherein:

the converter has a CIFF configuration or a CIFB configuration.

8. The delta-sigma modulation type A/D converter according to claim 1, wherein:

an input unit for inputting an analog input signal and a subsequent stage of an output unit of the quantizer function to perform a chopping operation.

9. The delta-sigma modulation type A/D converter according to claim 8, wherein:

an input unit for inputting the analog input signal, a preceding stage and a subsequent stage of a feedback capacitance of the first integrator and the second integrator, an input unit of the D/A converter for feeding back an output of a digital signal, and a subsequent stage of the quantizer function to perform a chopping operation.

10. The delta-sigma modulation type A/D converter according to claim 9, wherein:

only the chopping operation of the subsequent stage of an output unit of the quantizer is delayed by one A/D conversion timing than the input unit, the preceding stage and the subsequent stage of the feedback capacitance of the first integrator and the second integrator, and the input unit of the D/A converter.

* * * * *